(12) United States Patent
Kim et al.

(10) Patent No.: US 10,257,332 B2
(45) Date of Patent: Apr. 9, 2019

(54) PORTABLE TERMINAL AND A COMPONENT MOUNTING METHOD

(71) Applicant: Samsung Electronics Co., Ltd., Gyeonggi-do (KR)

(72) Inventors: Manho Kim, Gyeonggi-do (KR); Hwajoong Jung, Gyeonggi-do (KR); Youngseok Kim, Gyeonggi-do (KR); Youngkwon Yoon, Seoul (KR); Kihuk Lee, Gyeonggi-do (KR); Yonghwan Choi, Gyeonggi-do (KR); Sunhyoung Pyo, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 176 days.

(21) Appl. No.: 15/016,945

(22) Filed: Feb. 5, 2016

(65) Prior Publication Data

US 2016/0242289 A1   Aug. 18, 2016

(30) Foreign Application Priority Data

Feb. 12, 2015  (KR) .................. 10-2015-0021838

(51) Int. Cl.
| | | |
|---|---|---|
| H05K 1/18 | (2006.01) | |
| H04M 1/02 | (2006.01) | |
| H05K 3/34 | (2006.01) | |
| H05K 1/02 | (2006.01) | |
| H05K 3/30 | (2006.01) | |

(52) U.S. Cl.
CPC ....... *H04M 1/0277* (2013.01); *H04M 1/0202* (2013.01); *H05K 1/0271* (2013.01); *H05K 1/0274* (2013.01); *H05K 1/182* (2013.01); *H05K 1/183* (2013.01); *H05K 3/301* (2013.01); *H05K 3/341* (2013.01); *H05K 2201/1028* (2013.01);
(Continued)

(58) Field of Classification Search
CPC .. H05K 1/0293; H01L 23/49822; H01L 24/81
USPC .......... 174/259–264; 361/760–767, 772–774
See application file for complete search history.

(56) References Cited

U.S. PATENT DOCUMENTS

| | | | | |
|---|---|---|---|---|
| 5,323,947 A | * | 6/1994 | Juskey .................. | B23K 1/203 |
| | | | | 156/297 |
| 5,553,769 A | * | 9/1996 | Ellerson ................ | H01L 21/563 |
| | | | | 228/123.1 |

(Continued)

*Primary Examiner* — Tuan T Dinh
(74) *Attorney, Agent, or Firm* — Cha & Reiter, LLC

(57) ABSTRACT

An electronic device that includes a circuit board which is arranged between a front cover and a back cover, and includes a conductive pattern inserted into the circuit board. A signal generation or power supply element is electrically connected with the conductive pattern. An adhesion layer is attached onto the circuit board and overlaps at least part of the conductive pattern when viewed from above the circuit board. A first structure is arranged on the adhesion layer and overlaps at least part of the adhesion layer when viewed from above the circuit board. A second structure is arranged on a top of the first structure, overlaps at least part of the first structure when viewed from above the circuit board, and the second structure includes a bottom surface including metal. A metal layer is inserted between the first structure and the bottom surface of the second structure to attach the second structure to the first structure.

16 Claims, 19 Drawing Sheets

(52) U.S. Cl.
CPC ............... *H05K 2201/2009* (2013.01); *H05K 2203/0465* (2013.01)

(56) References Cited

U.S. PATENT DOCUMENTS

| | | | |
|---|---|---|---|
| 5,796,590 A * | 8/1998 | Klein | H01L 24/81 174/260 |
| 6,196,444 B1 * | 3/2001 | Davis | B23K 3/0623 156/236 |
| 6,228,197 B1 * | 5/2001 | Wang | H01L 24/31 156/152 |
| 6,916,685 B2 | 7/2005 | Yang et al. | |
| 2006/0131065 A1 * | 6/2006 | Ohwaki | H01L 23/49822 174/252 |
| 2009/0154122 A1 * | 6/2009 | Makamura | H05K 1/0293 361/761 |
| 2014/0233170 A1 * | 8/2014 | Hobson | H01Q 1/243 361/679.3 |

* cited by examiner

PORTABLE TERMINAL AND A COMPONENT MOUNTING METHOD

CLAIM OF PRIORITY

The present application claims the benefit of priority under 35 U.S.C. § 119 from Korean Application Serial No. 10-2015-0021838, which was filed in the Korean Intellectual Property Office on Feb. 12, 2015, the entire content of which is herein incorporated herein by reference.

BACKGROUND

1. Field of the Disclosure

The present disclosure relates generally to an electronic device, and more particularly to an electronic device which includes a circuit board for extending a region to install components thereon.

2. Description of the Related Art

Due to the recent developments in electronic communication industry, user devices (for example, electronic devices such as cellular phones, smart phones, electronic schedulers, personal multifunction terminals, laptop computers, and the like) have become essential items in order to rapidly transfer changing information in a modern society.

In general, the user device includes a circuit board. The circuit board is a part that connects a plurality of electronic components to one another, and supports data input/output exchange among constituent parts of the user device. The plurality of electronic components may be electrically connected to the circuit board by being installed on a conductive surface of the circuit board, or may be electrically connected to the circuit board using various electric connecting means (for example, a wire or a cable).

While the size of the present-day user device is limited or miniaturized more than ever, the electronic components for various functions or other instruments for supporting the electronic components are becoming voluminous. Therefore, it is difficult to install various components within a limited space of the user device.

SUMMARY

The present disclosure has been made to address at least some of the problems and disadvantages described above, and to provide at least some of the advantages described below.

Accordingly, an aspect of the present disclosure provides an electronic device for extending a region to additionally install components on a circuit board.

In accordance with an aspect of the present disclosure, a portable terminal is provided. The portable terminal includes a front cover, a back cover, and a circuit board arranged between the front cover and the back cover. The circuit board includes a conductive pattern inserted into the circuit board, and a signal generation or power supply element is electrically connected with the conductive pattern. An adhesion layer is attached onto the circuit board and positioned as to overlap at least part of the conductive pattern when viewed from above the circuit board. A first structure is arranged on the adhesion layer and overlaps at least part of the adhesion layer when viewed from above the circuit board. A second structure is arranged on top of the first structure so as to overlap at least part of the first structure when viewed from above the circuit board. The second structure includes a bottom surface comprised of metal. A metal layer is inserted between the first structure and the bottom surface of the second structure in order to attach the second structure to the first structure.

In accordance with another aspect of the present disclosure, an electronic device is provided. The electronic device includes a first member, a circuit board comprising a conductive pattern arranged therein, a second member arranged between the first member and the circuit board, and an adhesion layer arranged between the second member and the circuit board. The adhesion layer overlaps at least part of the conductive pattern of the circuit board, and the adhesion layer connects the second member to the circuit board. A metal layer is arranged between the first member and the second member and connects the first member to the second member.

In accordance with a further aspect of the present disclosure, a component mounting method is provided. The component mounting method includes forming a circuit board, connecting a metal sheet to one surface-treated surface of the circuit board, and connecting a component to the metal sheet using soldering.

According to various embodiments of the present disclosure, there is an advantage to install a component in a limited space of an electronic device by the adding of a region where a component can be installed on a circuit board.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
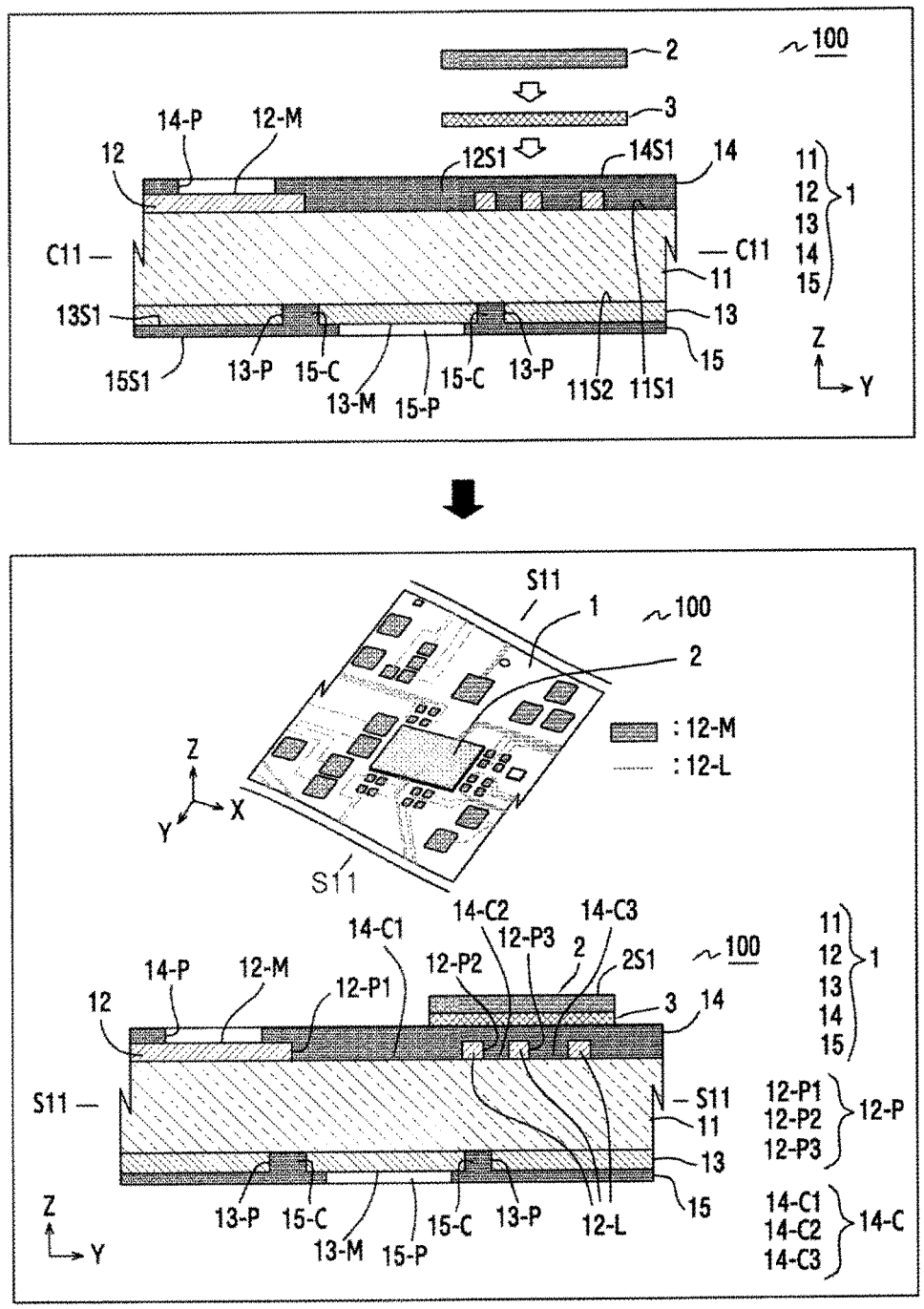
FIG. 1 illustrates a component mounting board according to an embodiment of the present disclosure.

The following description, with reference to the accompanying drawings, is provided to assist a person of ordinary skill in the art with a comprehensive understanding of various embodiments of the present disclosure as defined by the claims and their equivalents. Thus, the disclosure includes various specific details to assist in that understanding by the person of ordinary skill but these are to be regarded as merely exemplary. Accordingly, those of ordinary skill in the art will recognize that various changes and modifications of the various embodiments described herein can be made without departing from a thrust of the present disclosure. In addition, the descriptions of well-known functions and constructions may be omitted for clarity and conciseness when their inclusion may obscure the artisan's appreciation of the disclosure with such known functions and constructions.

The terms and words used in the following description and claims are not limited to the bibliographical meanings, but, are provided to enable a clear and consistent understanding of the present disclosure. Accordingly, it should be apparent to those skilled in the art that the following description of various embodiments of the present disclosure is provided for illustrative purposes only and not for the purpose of limiting the present disclosure as defined by the appended claims and their equivalents.

It is to be understood that the singular forms "a," "an," and "the" include plural references unless the context clearly dictates otherwise. Thus, for example, reference to "a component surface" includes reference to one or more of such surfaces.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components.

For example, a first user device and a second user device indicate different user devices although both of them are user devices.

It should be understood that when an element (e.g., first element) is referred to as being (operatively or communicatively) "connected," or "coupled," to another element (e.g., second element), the element may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may be understood to imply that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings similar to the contextual meanings in the relevant field of art, and are not to be interpreted to have ideal or excessively formal meanings unless clearly defined in the present disclosure. In some cases, a term defined in the present disclosure should not be interpreted to exclude embodiments of the present disclosure. Moreover, unless specified to the contrary, elements of different embodiments may be interchanged.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer-3 (MP3) player, a mobile medical device, a camera, and a wearable device. According to various embodiments of the present disclosure, the wearable device herein may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

According to various embodiments of the present disclosure, the electronic device herein may be a home appliance. The home appliance may include at least one of, for example, a television (TV), a digital video disc (DVD) player, an audio player, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™) a game console (e.g., Xbox™ and PlayStation™), an electronic dictionary, an electronic key, a camcorder, and an electronic photo frame.

According to another embodiment of the present disclosure, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or an Internet device of Things (e.g., a light bulb, various sensors, electric or gas meter, a sprinkler device, a fire alarm, a thermostat, a streetlamp, a toaster, a sporting goods, a hot water tank, a heater, a boiler, etc.), just to name a few non-limiting possibilities.

According to various embodiments of the present disclosure, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices.

The electronic device according to various embodiments of the present disclosure may be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

FIG. 1 illustrates a view showing a component mounting board according to an embodiment of the present disclosure.

Referring now to FIG. 1, the component mounting board 100 may include a circuit board 1 and a metal sheet 2. The circuit board 1 may include a plurality of layers 11, 12, 13, 14, and 15. According to various embodiments, the term "layer" may be substituted with the terms such as "sheet," "film," "stratum," or the like.

The first layer 11 of the circuit board 1 may be arranged between the second layer 12 and the third layer 13. According to an embodiment, the first layer 11 may be formed of a nonconductive material or an insulating material. The first layer 11 may further include a conductive material in part. In addition, the first layer 11 may have substantially uniform thickness, but this should not be considered as limiting, as the thickness may be varied and non-uniform.

The second layer 12 of the circuit board 1 may be arranged between the first layer 11 and the fourth layer 14. The second layer 12 may be arranged on one surface 11S1 of the first layer 11 and may cover at least part of the one surface 11S1 of the first layer 11. The second layer 12 may be formed of a conductive material (for example, copper). In addition, the second layer 12 may have substantially uniform thickness, but this should not be considered as limiting and the second layer 12 may have different thickness in part.

The third layer 13 of the circuit board 1 may be arranged between the first layer 11 and the fifth layer 15. The third layer 13 may be arranged on the other surface 11 S2 of the first layer 11 and may cover at least part of the other surface 11 S2 of the first layer 11. According to an embodiment, the third layer 13 may be formed of a conductive material (for example, copper). Alternatively, the third layer 13 may be formed of the same material as the second layer 12 or a different material. In addition, the third layer 13 may have substantially uniform thickness, but this should not be considered as limiting and the third layer 13 may have different thickness in part.

The fourth layer 14 of the circuit board 1 may be arranged on the outermost portion of the circuit board 1, and serve to protect the circuit board 1 from the exterior. The fourth layer 14 may be arranged on one surface 12S1 of the second layer 12 and may cover at least part of the one surface 12S1 of the second layer 12. According to an embodiment, the fourth layer 14 may be formed of a nonconductive material, for example, a photo liquid solder resist ink (PSR). In addition, the fourth layer 14 may have a substantially uniform thickness, but this should not be considered as limiting.

According to an embodiment of the present disclosure, the second layer 12 may include one or more penetrating portions 12-P which are formed by removing a part of the second layer 12. The fourth layer 14 may include filling portions 14-C filled in with at least one of the one or more penetrating portions 12-P of the second layer 12. The filling portions 14-C may be in contact with the one surface 11S1 of the first layer 11.

The fifth layer 15 of the circuit board 1 may be arranged on the outermost portion of the circuit board 1, and serve to protect the circuit board 1 from the exterior. The fifth layer 15 may be arranged on one surface 13S1 of the third layer 13 and may cover at least part of the one surface 13S1 of the third layer 13. The fifth layer 15 may be formed of a nonconductive material, for example, a PSR. In addition, the fifth layer may have substantially uniform thickness, but this should not be considered as limiting.

According to an embodiment of the present disclosure, the third layer 13 may include at least one penetrating portion 13-P formed by removing a part of the third layer 13. The fifth layer 15 may include a filling portion 15-C filled in the penetrating portion 13-P of the third layer 13. The filling portion 15-C may be in contact with the one surface 11S2 of the first layer 11.

According to various embodiments of the present disclosure, the fourth layer 14 and/or the fifth layer 15 may be formed through post-processing. The post-processing may include an operation of performing a surface treatment with respect to a processed product according to a use characteristic. For example, the fourth layer 14 and the fifth layer 15 may be formed by forming the first layer 11, the second layer 12, and the third layer 13 and then coating the surface 12S1 of the second layer 12 and the surface 13S1 of the third layer 13 with a nonconductive material. The original function of the circuit board 1 (for example, forming an electric circuit) can be performed even when the fourth layer 14 or the fifth layer 15 is not formed. However, the circuit board 1 may have an improved function, such as insulating and protecting from external forces and elements, by adding the fourth layer 14 and the fifth layer 15.

According to various embodiments of the present disclosure, the fourth layer 14 may include at least one penetrating portion 14-P formed by removing a part of the fourth layer 14. One surface 12-M of the second layer 12 may be exposed through the penetrating portion 14-P of the fourth layer 14. According to an embodiment, the one surface 12-M of the second layer 12 may be used as a pad or a land for installing an electronic component thereon. For example, the electronic component may be connected to the one surface 12-M of the second layer 12 by using soldering. Alternatively, a contact of the electronic component may be in electrical contact with the one surface 12-M of the second layer 12.

According to various embodiments, the fifth layer 15 may include at least one penetrating portion 15-P formed by removing a part of the fifth layer 15. One surface 13-M of the third layer 13 may be exposed through the penetrating portion 15-P of the fifth layer 15. According to an embodiment, the one surface 13-M of the third layer 13 may be used as a pad or land for installing an electronic component thereon.

According to various embodiments, the second layer 12 and/or the third layer 13 may include a plurality of connection lines 12-L. The plurality of connection lines 12-L may connect between the portions which are separated from each other on the circuit board 1. Alternatively, the plurality of connection lines 12-L may be used to transmit power signals, data signals, etc. Alternatively, the plurality of connection lines 12-L may be used to connect a ground. According to an embodiment, the fourth layer 14 and/or the fifth layer 15 may be constructed to permit light transmittance, and thus may allow the connection lines 12-L of the second layer 12 and/or the third layer 13 to be seen from the outside therethrough.

According to various embodiments of the present disclosure, the plurality of connection lines 12-L of the second layer 12 or the one surface 12-M for soldering may be formed on the portions of the second layer 12 except for the one or more penetrating portions 12-P. In addition, the plurality of connection lines (not shown) of the third layer 13 or the one surface 13-M for soldering may also be formed on the portions of the third layer 13 except for the at least one penetrating portion 13-P. For example, the one or more penetrating portions 12-P, the one surface 12-M for soldering, and the plurality of connection lines 12-L may be constructed by forming a layer by coating the one surface 11S1 of the first layer 11 with a conductive material, and then removing pre-defined regions from the layer.

According to an embodiment of the present disclosure, the circuit board 1 may have stiffness to prevent deformation. According to another embodiment, the circuit board 1 may have a flexible shape, for example, to be bent, folded, twisted, or crooked.

The metal sheet 2 may be connected to the circuit board 1. According to an embodiment of the present disclosure, the metal sheet 2 may be connected to one surface 14S1 of the fourth layer 14 of the circuit board 1 via an adhesion sheet 3. Alternatively, although not shown, the metal sheet 2 may be additionally connected to one surface 15S1 of the fifth layer 15. The metal sheet 2 may have a substantially uniform thickness, but this should not be considered as limiting.

According to various embodiments of the present disclosure, the metal sheet 2 may be formed on the one surface 14S1 of the fourth layer 14 and/or the one surface 15S1 of the fifth layer 15 through plating, and the adhesion sheet 3 may be omitted.

According to an embodiment of the present disclosure, the adhesion sheet 3 may be arranged on the one surface 14S1 of the fourth layer 14 so as not to overlap the plurality of connection lines 12-L of the second layer 12.

According to various embodiments of the present disclosure, the adhesion sheet 3 may be arranged on the one surface 14S1 of the fourth layer 14 so as to overlap the plurality of connection lines 12-L of the second layer 12 as shown in the drawing. According to an embodiment, the plurality of connection lines 12-L of the second layer 12 may be arranged between the adhesion sheet 3 and the first layer 11. According to another embodiment, although not shown, the plurality of connection lines 12-L of the second layer 12 may be arranged on the one surface 14S1 of the fourth layer 14, and the adhesion sheet 3 may be connected to the top of the fourth layer 14 with the plurality of connection lines 12-L being exposed. In this case, the adhesion sheet 3 may be formed of a nonconductive material and thus may not apply an electric current to the connection lines 12-L.

According to various embodiments of the present disclosure, the adhesion sheet 3 may be installed so as not to overlap the penetrating portion 14-P of the fourth layer 14, and may not hide the one surface 12-M of the second layer 12 for soldering. The adhesion sheet 3 may have various shapes as desired. For example, the adhesion sheet 3 may have a rectangular shape as shown in the drawing, or may be formed in any type of polygon or non-polygon shape such that the adhesion sheet 3 does not hide the one surface 12-M of the second layer 12 for soldering.

According to various embodiments of the present disclosure, the metal sheet 2 may be arranged on the one surface 14S1 of the fourth layer 14 so as not to overlap the plurality of connection lines 12-L of the second layer 12.

According to various embodiments of the present disclosure, the metal sheet 2 may be arranged on the one surface 14S1 of the fourth layer 14 so as to overlap the plurality of connection lines 12-L of the second layer 12 as shown in the drawing. According to an embodiment, the plurality of connection lines 12-L of the second layer 12 may be arranged between the metal sheet 2 and the first layer 11.

According to various embodiments of the present disclosure, the metal sheet 2 may be installed so as not to overlap the penetrating portion 14-P of the fourth layer 14, and may not hide the one surface 12-M of the second layer 12 for soldering. The metal sheet 2 may have various shapes. For example, although not shown, the metal sheet 2 may have a rectangular shape or any other type of regular or irregular shape such that the metal sheet 2 does not hide the one surface 12-M of the second layer 12 for soldering.

According to various embodiments of the present disclosure, the metal sheet 2 may be shaped to completely cover the adhesion sheet 3. For example, the metal sheet 2 may be shaped to completely overlap the adhesion sheet 3.

According to various embodiments of the present disclosure, the metal sheet 2 may have various shapes according to a component to be connected by soldering. For example, when the component has a relatively large contact surface, the size of the metal sheet 2 may be increased. According to an embodiment, the component may be adjacent to a component installed on the one surface 12-M for soldering, but does not interfere with this component.

The metal sheet 2 may be used in the case where a component (for example, an electronic component or other instrument(s)) is connected using soldering. One surface 2S1 of the metal sheet 2 may have various shapes (for example, a plane, a curved surface, etc.) according to a component to be soldered. For example, the one surface 2S1 of the metal sheet 2 may have a surface (for example, a plane, a curved surface, etc.) corresponding to one surface of a component to be soldered. The metal sheet 2 may be formed of a material which is conducive to solder, such as copper, etc.

According to an embodiment of the present disclosure, the metal sheet 2 may be insulated from the circuit board 1.

According to various embodiments of the present disclosure, the metal sheet 2 may be electrically connected to the circuit board 1. For example, one end of the metal sheet 2 may be connected to the one surface 12-M, 13-M of the circuit board 1 using soldering. Alternatively, the one end of the metal sheet 2 may be in contact with the one surface 12-M, 13-M of the circuit board 1. Alternatively, an electrical connector (for example, a wire or a cable) may be additionally provided to electrically connect between the metal sheet 2 and the circuit board 1. Alternatively, the metal sheet 2 may be used as an additional ground of the circuit board 1. According to the above-described configuration, the metal sheet 2 may serve to electrically connect the components and the circuit board 1.

According to an embodiment of the present disclosure, the metal sheet 2 may be connected to the circuit board 1 as an integral unit with the circuit board 1. However, the metal sheet 2 may be treated as an element which is not included in the circuit board 1. In addition, the metal sheet 2 may be formed with the circuit board 1, but may be treated as an element which is not included in the circuit board 1. For example, the circuit board 1 may include a printed circuit board (PCB) or a flexible printed circuit board (FPCB), but the metal sheet 2 may not be regarded as a part of the PCB or FPCB. The component mounting board 100 may provide the metal sheet 2 for connecting components by soldering, instead of the one surface 12-M, 13-M of the circuit board 1. This feature differs from a related-art component soldering connection method using a pad on a PCB.

According to another embodiment of the present disclosure, the component mounting board 100 including the metal sheet 2 and the circuit board 1 may be treated as a single circuit board (for example, a PCB or an FPCB). The component mounting board 100 has the feature of including the metal sheet 2 for connecting components by soldering on the one surface 14S1, 15S1 of the circuit board 1 which has undergone surface treatment. This feature differ from the related-art PCB or FPCB.

Figure 2:
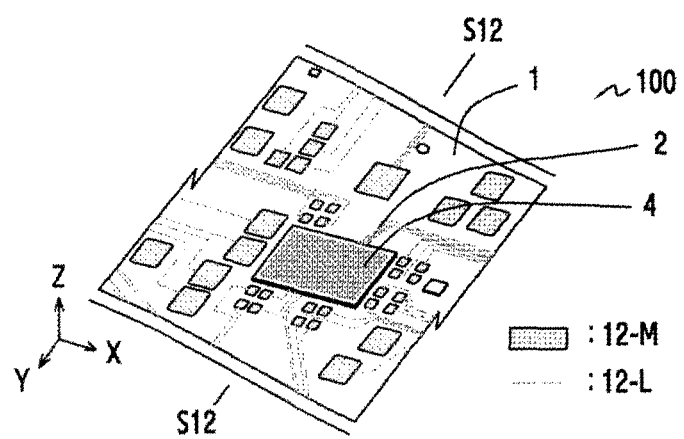
FIG. 2 and FIG. 3 illustrate a process of installing a component on a component mounting board according to an embodiment of the present disclosure.
Figure 2:
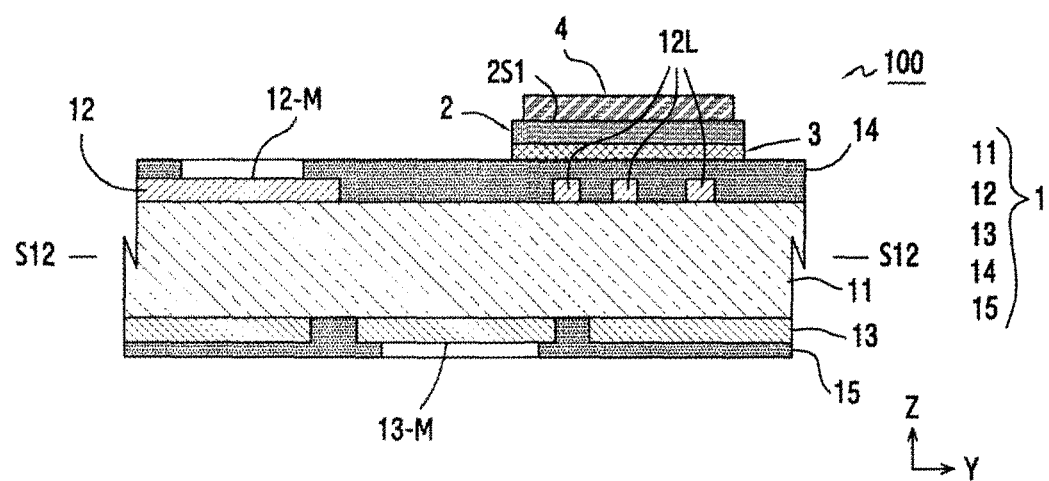
Figure 3:
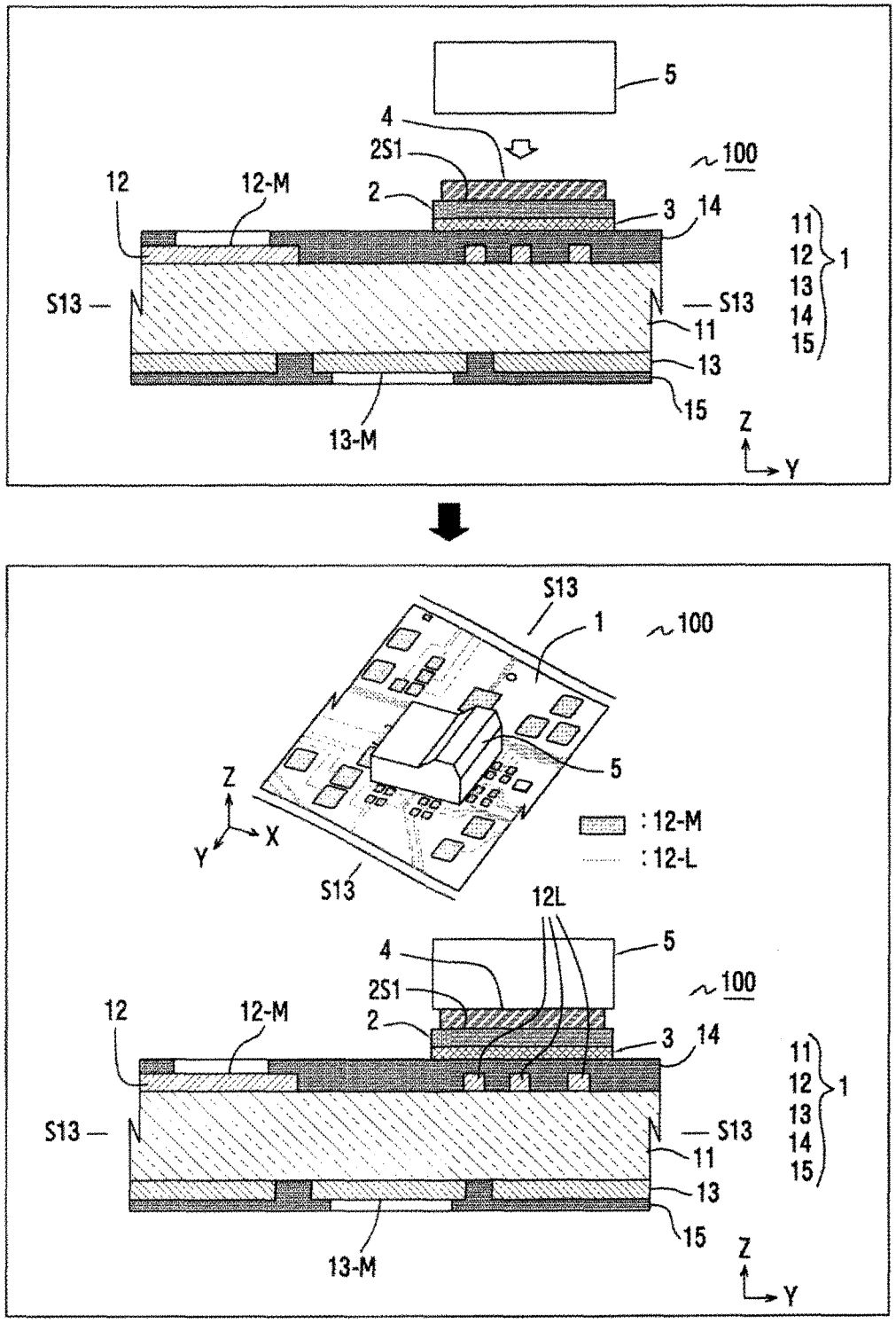

FIGS. 2 and 3 illustrate a process of installing a component on a component mounting board according to an embodiment of the present disclosure.

Referring now to FIG. 2, solder 4 (or lead) for soldering may be arranged on at least part of the one surface 2S1 of the metal sheet 2 of the component mounting board 100 described above in FIG. 1.

Referring now to FIG. 3, a component 5 may be connected to the metal sheet 2 using the solder 4. In general, a surface mounting method may refer to connecting a component to a pad on a PCB using soldering. Connecting a component to the metal sheet 2 using soldering according to an embodiment may be considered as a part of the surface mounting method. According to various embodiments of the present disclosure, a component to be connected to the one surface 12-M, 13-M of the circuit board and a component to be connected to the one surface 2S1 of the metal sheet 2 may be installed on the component mounting board 100 together during a surface mounting process.

Figure 4A:
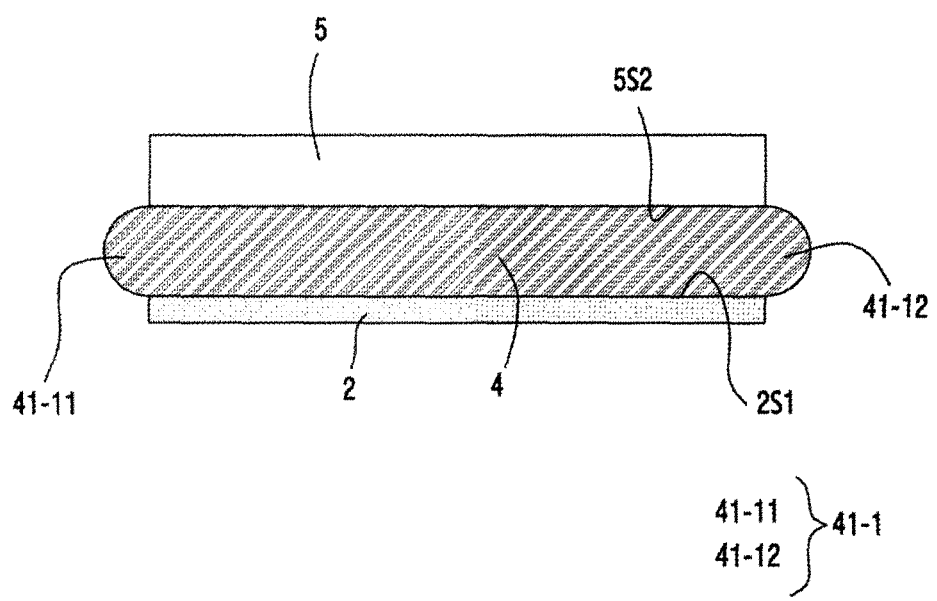
FIG. 4A and FIG. 4B illustrate schematically showing soldering between a metal sheet and a component according to various embodiments of the present disclosure.
Figure 4B:
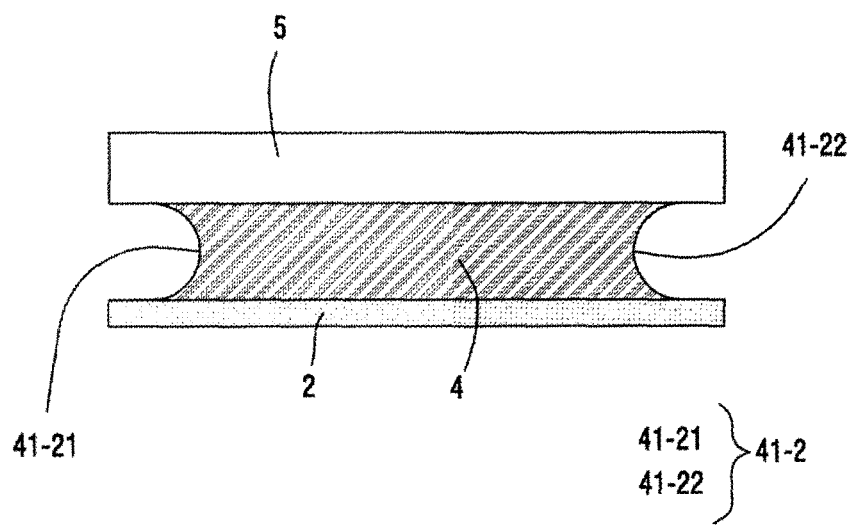

FIGS. 4A and 4B illustrate soldering between a metal sheet and a component according to various embodiments of the present disclosure. The metal sheet 2 and the component 5 may be connected to each other by placing the solder 4 between the metal sheet 2 and the component 5, melting the solder (4 of FIG. 3) by heating, and then cooling (that is, a soldering process). The solder 4 may have its shape changed from an initial shape through soldering. FIGS. 4A and 4B illustrate the shape of the solder 4 after soldering.

Referring now to FIG. 4A, the solder 4 may have a convex portion 41-1. According to an embodiment, the convex portion 41-1 (comprised of 41-11 and 41-12) may be formed beyond a space between the metal sheet 2 and the component 5. When the amount of solder 4 is greater than the space between the metal sheet 2 and the component 5, the convex portion 41-1 may be formed. Alternatively, the convex portion 41-1 may be formed in a process in which the component 5 is brought close to the metal sheet 2 even if the amount of solder 4 is small. The convex portion 41-1 may be intentionally formed.

According to various embodiments of the present disclosure, the one surface 2S1 of the metal sheet 2 and one surface 5S2 of the component 5 may be in parallel with each other. According to an embodiment, the convex portion 41-11 at one side may have a similar shape to that of the convex portion 41-12 at the other side.

According to various embodiments of the present disclosure, the one surface 2S1 of the metal sheet 2 and the one surface 5S2 of the component 5 may not be in parallel with each other. According to an embodiment, the convex portion 41-11 at one side may have a different shape from that of the convex portion 41-12 at the other side.

Referring now to FIG. 4B, the solder 4 may have a concave portion 41-2 comprised of two ends 41-21 and 41-22. According to an embodiment, the concave portion 41-2 may be formed without being beyond the space between the metal sheet 2 and the component 5. When the amount of solder 4 is smaller than the space between the metal sheet 2 and the component 5, the concave portion 41-2 may be formed. Alternatively, when the component 5 is intentionally or unintentionally placed at a relatively short distance from the metal sheet 2 with the solder 4 being melted between the component 5 and the metal sheet 2, the concave portion 41-2 may be formed. For example, the distance between the components 5 and the metal sheet 2 may be less than 5 mm. If the distance between the component 5 and the metal sheet 2 is intentionally or unintentionally increased while a certain amount of the melted solder 4 is disposed between the component 5 and the metal sheet 2, the concave portion 41-2 may be formed because of properties of the melted solder 4 (e.g., viscosity, tension, etc.).

According to various embodiments of the present disclosure, the one surface 2S1 of the metal sheet 2 and the one surface 5S2 of the component 5 may be in parallel with each other. According to an embodiment, the concave portion 41-21 at one side may have a similar shape to that of the concave portion 41-22 at the other side.

According to various embodiments of the present disclosure, the one surface 2S1 of the metal sheet 2 and the one surface 5S2 of the component 5 may not be in parallel with each other. According to an embodiment, the concave portion 41-21 at one side may have a different shape from that of the concave portion 41-22 at the other side.

According to various embodiments of the present disclosure, the shape of the solder 4 may vary according to a property of the solder 4 (for example, a melting point, etc.) or a soldering environment (for example, ambient temperature), etc.

According to various embodiments of the present disclosure, various other metals may be used instead of the solder 4. Various connection methods may be used to connect between the metal sheet 2 and the component 5.

Figure 5:
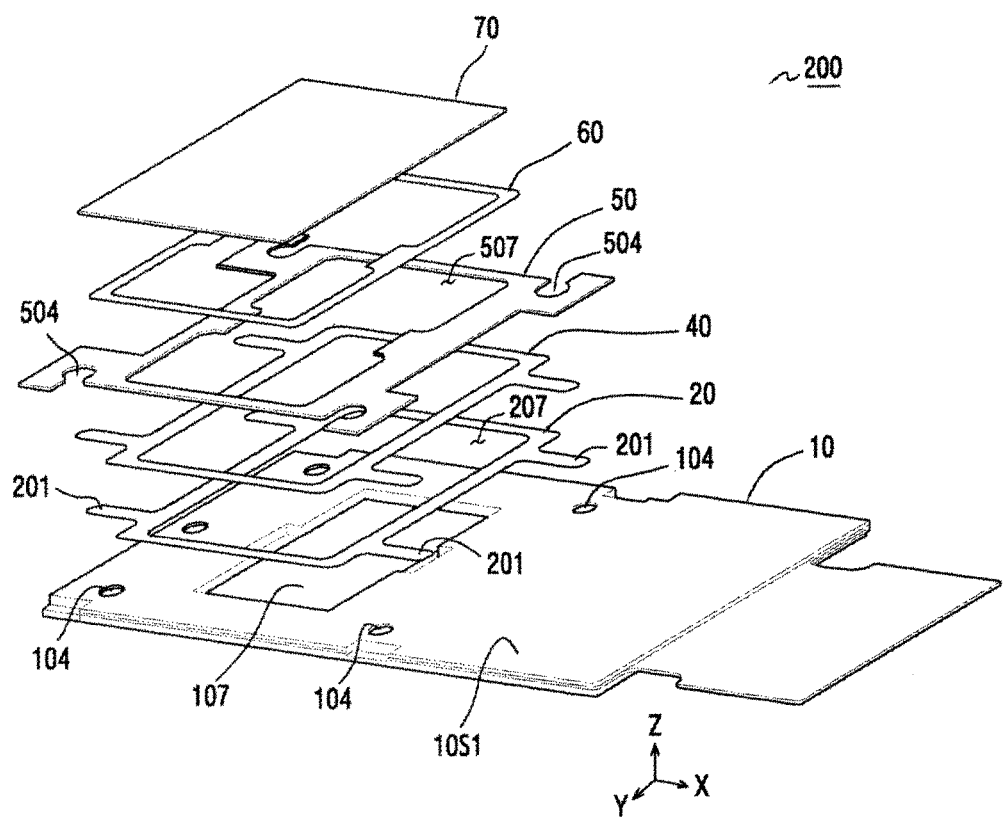
FIG. 5 illustrates in an exploded view s of a component mounting module according to various embodiments of the present disclosure.
Figure 6:
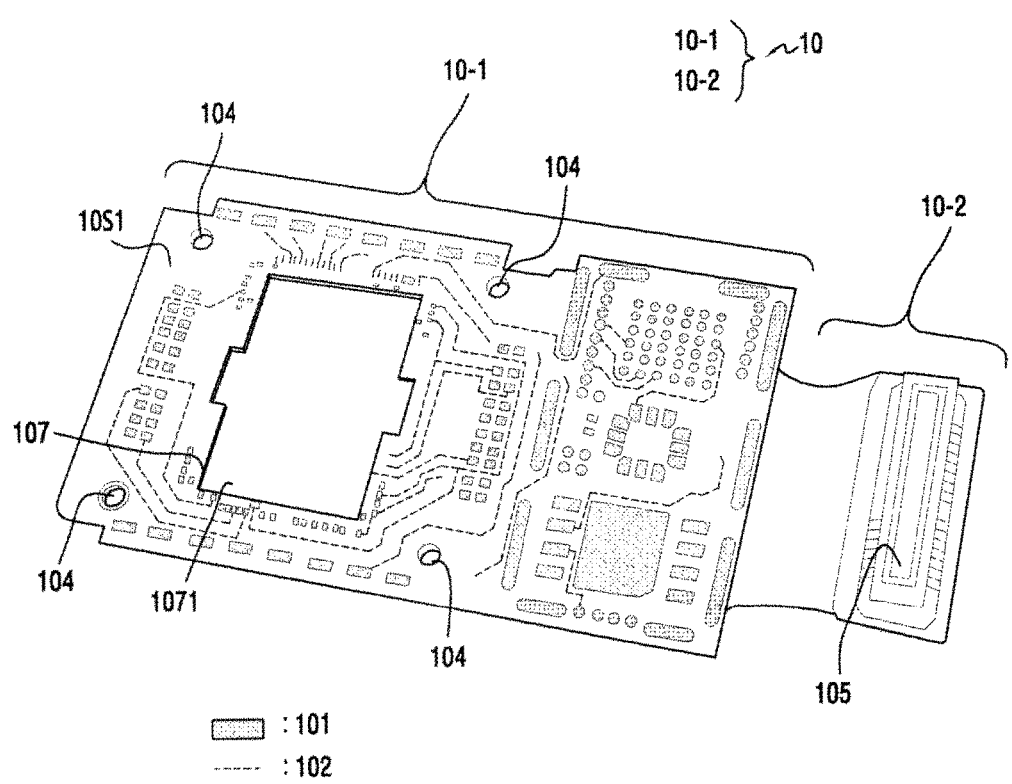
FIG. 6 illustrates a configuration of a circuit board in detail according to various embodiments of the present disclosure.
Figure 7:
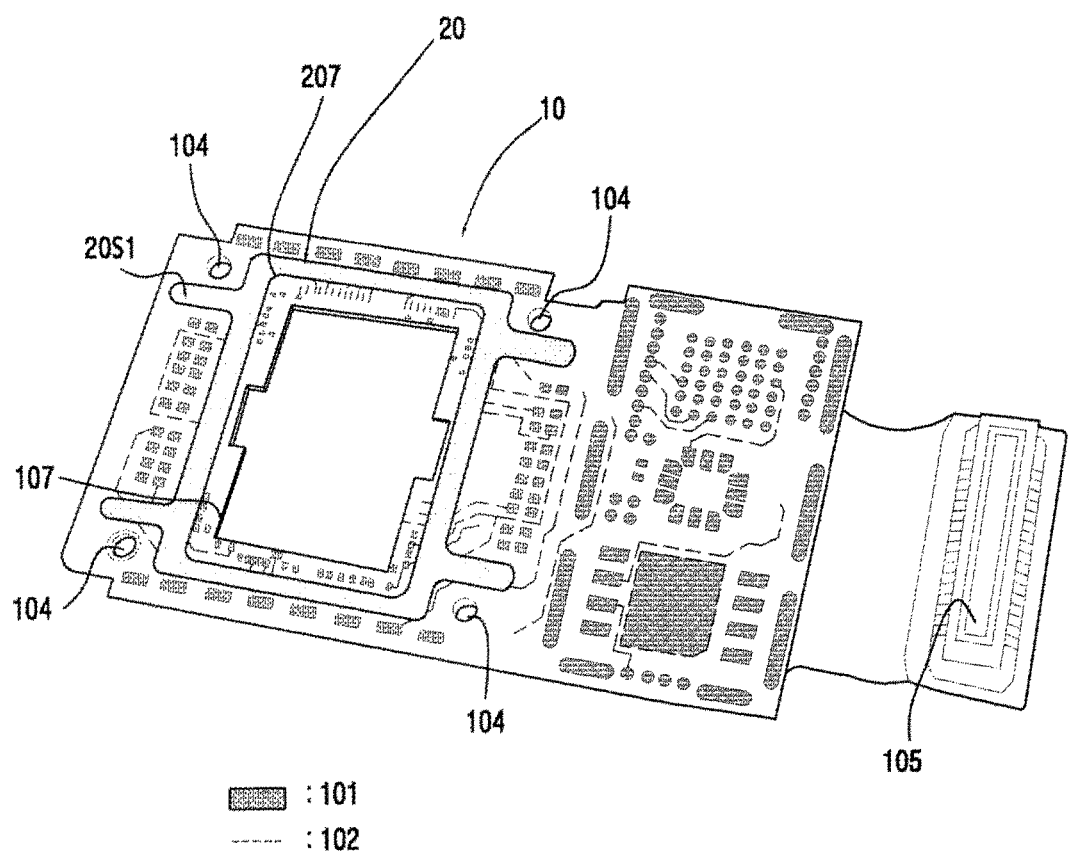
FIG. 7 illustrates a circuit board and a metal sheet which are connected to each other according to an embodiment of the present disclosure.
Figure 8:
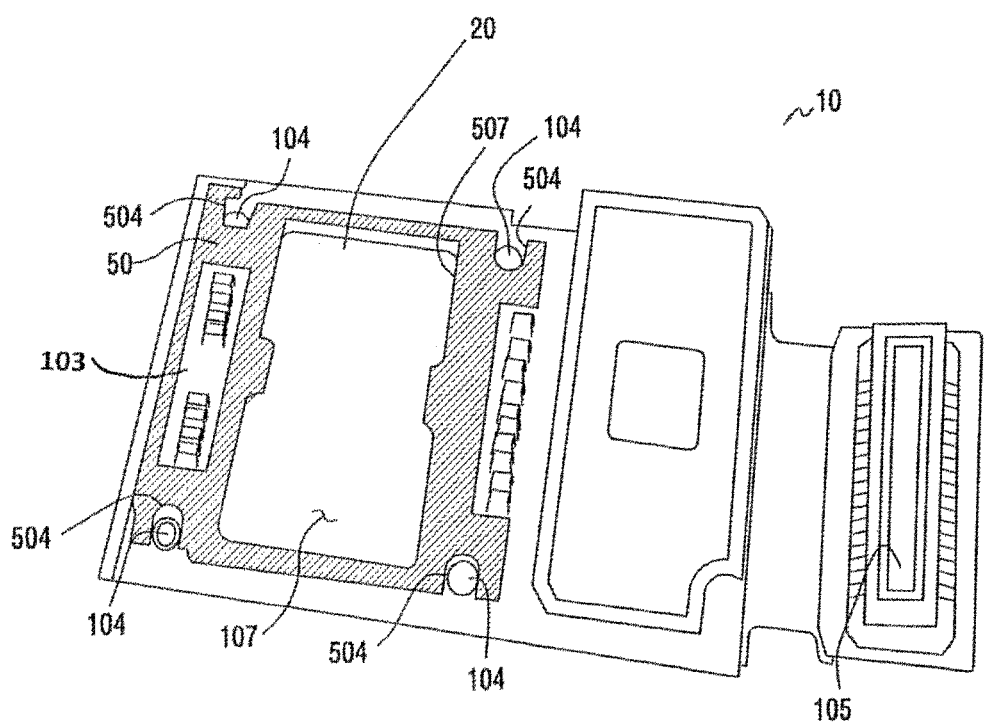
FIG. 8 illustrates a bracket which is connected onto a metal sheet connected to a circuit board according to an embodiment of the present disclosure.

FIG. 5 illustrates a configuration of a component mounting module according to various embodiments of the present disclosure. FIG. 6 illustrates a configuration of a circuit board in detail according to an embodiment of the present disclosure. FIG. 7 illustrates a view showing a circuit board and a metal sheet which are connected to each other according to an embodiment of the present disclosure. In addition, FIG. 8 illustrates a view showing a bracket which is connected onto a metal sheet connected to a circuit board according to an embodiment of the present disclosure.

According to an embodiment of the present disclosure, the component mounting module 200 may include a circuit board 10, a metal sheet 20, solder 40, and a bracket 50.

Referring now to FIGS. 5 and 6, the circuit board 10 may include a board portion 10-1 and a connection portion 10-2. According to various embodiments, the circuit board 10 may be the circuit board 1 of FIG. 1. The board portion 10-1 may be substantially flat and may include a plurality of pads or lands 101 (for example, 12-M or 13-M of FIG. 1) arranged on one surface 10S1 thereof. The plurality of pads or lands 101 may be regions for connecting electronic components such as a diode, a capacitor, etc. using soldering. According to an embodiment, the one surface 10S1 of the circuit board 10 may include a nonconductive layer (not shown) (for example, the fourth layer 14 or the fifth layer 15 of FIG. 1) which is coated during a surface treatment process, and the pads or lands 101 may be exposed through penetrating portions (for example, the penetrating portions 14-P or 15-P of FIG. 1) of the nonconductive layer.

The board portion 10-1 may include a plurality of connection lines 102. The connection lines 102 may electrically connect between the plurality of pads or lands 101. According to an embodiment of the present disclosure, the one surface 10S1 of the circuit board 10 may include a nonconductive layer (for example, the fourth layer 14 or the fifth layer 15 of FIG. 1) which is coated during a surface treatment process. According to an embodiment, the nonconductive layer may have light transmittance and allow the connection lines 102 to be seen from the outside therethrough.

The board portion 10-1 may further include a recess 107. According to an embodiment of the present disclosure, the recess 107 may be a rectangular recess, and the plurality of pads or lands 101 arranged along the border of the recess 107 may be arranged on the one surface 10S1. Electronic components (not shown) such as a processor or microprocessor, a micro controller, a sensor (for example, an image sensor), etc. may be installed on the substrate portion 10-1 as follows. The electronic component may be arranged on the recess 107 and a plurality of leads of the electronic component may be connected to the plurality of pads or lands 101 which are arranged along the border of the recess 107 using soldering. The electronic component may be supported by a bottom 1071 of the recess 107, and the bottom 1071 of the recess 107 may help in improving flatness of the electronic component.

The board portion 10-1 may further include a plurality of penetrating holes 104. The plurality of penetrating holes 104 may be used for bolt-securing and the board portion 10-1 may be connected to an appropriate place using bolt-securing.

The connection portion 10-2 may extend from the board portion 10-1 and includes a connector 105. According to an embodiment, the connector 105 may be electrically connected to another circuit board (for example, a main board, a mother board, a PCB, or etc. of the electronic device), and the connection portion 10-2 may electrically connect between the board portion 10-1 and another circuit board. In addition, the connection portion 10-2 may have flexibility so that it can be bent or folded. For example, the connection portion 10-2 may include an FPCB.

With reference to FIG. 5, the metal sheet 20 may be arranged between the circuit board 10 and the solder 40, and may be connected to the one surface 10S1 of the circuit board 10. According to various embodiments, the metal sheet 20 may be the metal sheet 2 of FIG. 1. According to an embodiment of the present disclosure, the metal sheet 210 may have a substantially annular shape. For example, as shown in the drawing, the metal sheet 20 may have a substantially rectangular shape (e.g. fillet-shaped rounded corners), and may have a rectangular penetrating portion 207 formed through the center thereof. Additionally, the metal sheet 20 may include a plurality of extension portions 201 extending from the border thereof toward the outside.

According to an embodiment of the present disclosure, the metal sheet 20 may be arranged so as not to overlap the plurality of pads or lands 101 arranged on the one surface 10S1 of the circuit board 10. In addition, the metal sheet 20 may be arranged so as to overlap the connection lines 102 of the circuit board 10. According to an embodiment, the one surface 10S1 of the circuit board 10 may include a nonconductive layer (for example, the fourth layer 14 or the fifth layer 15 of FIG. 1) which is formed during a surface treatment process, and the metal sheet 20 and the connection lines 102 may be insulated from each other by this nonconductive layer.

According to an embodiment of the present disclosure, the metal sheet 20 may be connected to the one surface 10S1 of the circuit board 1 via an adhesion sheet (not shown). Alternatively, although not shown, the metal sheet 2 may be formed by plating and the adhesion sheet may be omitted.

Referring now to FIG. 7, the metal sheet 20 may have a shape such that it does not overlap the pads or lands 101 of the circuit board 10. The shape of the metal sheet may be formed not to hide the pads or lands 101 of the circuit board 10 for mounting an electronic component onto a surface. According to an embodiment, an electronic component (for example, an image sensor) (not shown) mounted into a recess 107 of the circuit board 10 may be exposed through the penetrating portion 207 of the annular metal sheet 20.

The solder 40 may be arranged between the metal sheet 20 and the bracket 50 and used for soldering to connect between the metal sheet 20 and the bracket 50. According to various embodiments, the solder 40 may be the solder 4 of FIG. 2. The solder 40 may be arranged on at least part of one surface 20S1 of the metal sheet 20 and may be formed in a substantially annular shape.

The bracket 50 may be connected to the metal sheet 20 using the solder 40 arranged on the one surface 20S1 of the metal sheet 20. The bracket 50 may have at least part formed of metal. According to an embodiment of the present disclosure, the bracket 50 may have a rectangular annular shape which is substantially the same as the shape of the metal sheet 20.

Referring now to FIG. 8, the bracket 50 may have a shape to cover more regions on the one surface 10S1 of the circuit board 10 than the metal sheet 20. According to an embodiment, an electronic component (for example, an image sensor) (not shown) mounted into the recess 107 of the circuit board 10 may be exposed through a penetrating portion 507 of the annular bracket 50. Additionally, the bracket 50 may include a plurality of penetrating holes 504.

According to an embodiment, the plurality of penetrating holes 504 may be arranged to correspond to the plurality of penetrating holes 104 of the circuit board 10. The plurality of penetrating holes 504 may be used for bolt-securing and the bracket 50 and the circuit board 10 may be connected with each other using bolt-securing.

According to an embodiment of the present disclosure, components connected to the pads or lands 101 of the circuit board 10, and a component (for example, the bracket 50) connected to the metal sheet 20 may be installed on the component mounting board 100 altogether in a surface mounting process.

According to various embodiments of the present disclosure, a component may be installed on the metal sheet 20 after components are installed on the pads or lands 101 of the circuit board 10. Alternatively, components may be installed on the surfaces of the pads or lands 101 of the circuit board 10 after a component is installed on the metal sheet 20. Alternatively, the process of installing a component on the metal sheet may be performed during the process of installing components on the pads or lands 101 of the circuit board 10.

According to an embodiment of the present disclosure, the component installed on the recess 107 of the circuit board 10 may be an image sensor (not shown) for photographing. The image sensor may detect light which enters through the penetrating portion 507 of the bracket 50. Additionally, the component mounting module 200 may further include a light transmission sheet 70. The light transmission sheet 70 may be connected to the bracket 50 via an adhesion sheet 60. According to an embodiment, the light transmission sheet 70 may block the penetrating portion 507 of the bracket 50. The light may enter the image sensor through the light transmission sheet 70. The light transmission sheet 70 according to an embodiment of the present disclosure may be a filter sheet which can block infrared rays.

Figure 9:
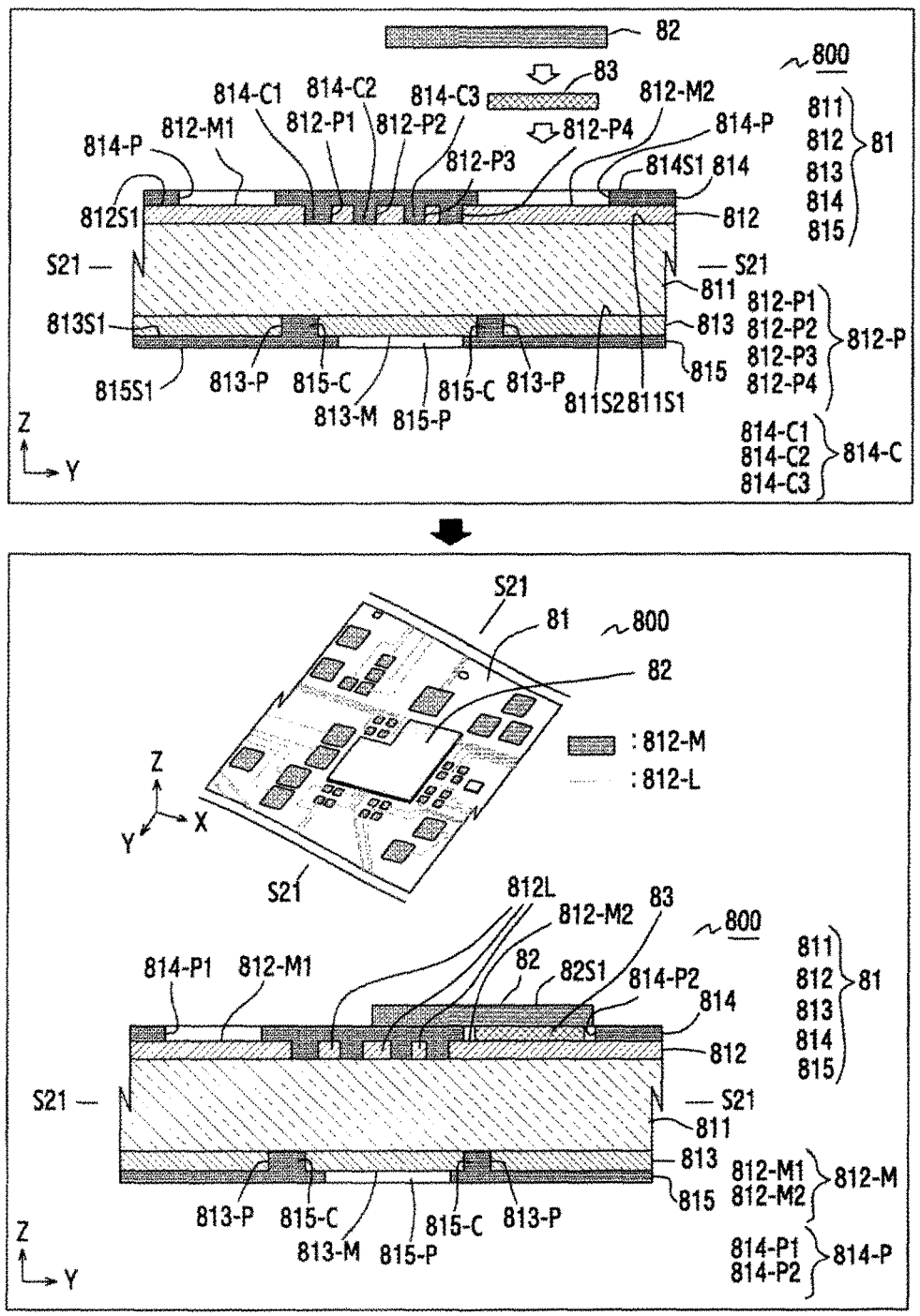
FIG. 9 illustrates a component mounting board according to another embodiment of the present disclosure.

FIG. 9 illustrates a view showing a component mounting board according to another embodiment of the present disclosure.

Referring now to FIG. 9, the component mounting board 300 may include a circuit board 81 and a metal sheet 82. The circuit board 81 may include a plurality of layers 811, 812, 813, 814, and 815.

The first layer 811 of the circuit board 81 may be arranged between the second layer 812 and the third layer 813. According to an embodiment, the first layer 811 may be formed of a nonconductive material or an insulating material. The first layer 811 may further include a conductive material in part. In addition, the first layer 811 may have substantially uniform thickness, but this should not be considered as limiting.

The second layer 812 of the circuit board 81 may be arranged between the first layer 811 and the fourth layer 814. The second layer 812 may be arranged on one surface 811S1 of the first layer 811 and may cover at least part of the one surface 811S1 of the first layer 811. The second layer 812 may be formed of a conductive material (for example, copper). In addition, the second layer 812 may have substantially uniform thickness, but this should not be considered as limiting and the second layer 812 may have different thickness in part.

The third layer 813 of the circuit board 81 may be arranged between the first layer 811 and the fifth layer 815. The third layer 813 may be arranged on the other surface 811 S2 of the first layer 811 and may cover at least part of the other surface 811S2 of the first layer 811. According to an embodiment, the third layer 813 may be formed of a conductive material (for example, copper). Alternatively, the third layer 813 may be formed of the same material as the second layer 812 or a different material. In addition, the third layer 813 may have substantially uniform thickness, but this should not be considered as limiting and the third layer 813 may have different thickness in part.

The fourth layer 814 of the circuit board 81 may be arranged on the outermost portion of the circuit board 81, and serve to protect the circuit board 81 from external conditions. The fourth layer 814 may be arranged on one surface 812S1 of the second layer 812 and cover at least part of the one surface 812S1 of the second layer 812. According to an embodiment, the fourth layer 814 may be formed of a nonconductive material, for example, a PSR. In addition, the fourth layer 814 may have substantially uniform thickness, but this should not be considered as limiting.

According to an embodiment of the present disclosure, the second layer 812 may include one or more penetrating portions 812-P formed by removing a part of the second layer 812. According to an embodiment, the fourth layer 814 may include filling portions 814-C filled in at least one of the one or more penetrating portions 812-P of the second layer 812. The filling portions 814-C may be in contact with the one surface 811S1 of the first layer 811.

The fifth layer 815 of the circuit board 81 may be arranged on the outermost portion of the circuit board 81, and serve to protect the circuit board 81 from the outside. The fifth layer 815 may be arranged on one surface 813S1 of the third layer 813 and cover at least part of the one surface 813S1 of the third layer 813. According to an embodiment, the fifth layer 815 may be formed of a nonconductive material, for example, a PSR. In addition, the fifth layer 815 may have substantially uniform thickness, but this should not be considered as limiting.

According to various embodiments of the present disclosure, the fourth layer 814 and/or the fifth layer 815 may be formed through post-processing. For example, the fourth layer 814 and the fifth layer 815 may be formed by forming the first layer 811, the second layer 812, and the third layer 813, and then coating the surface 812S1 of the second layer 812 and the surface 813S1 of the third layer 813 with a nonconductive material. The original function (for example, forming an electric circuit) of the circuit board 81 can be performed even if the fourth layer 814 or the fifth layer 815 is not formed, but the circuit board 81 may have an improved function such as insulating and protecting from the outside by adding the fourth layer 814 and the fifth layer 815.

According to various embodiments of the present disclosure, the fourth layer 814 may include at least one penetrating portion 814-P formed by removing a part of the fourth layer 814. One surface 812-M of the second layer 812 may be exposed through the penetrating portion 814-P of the fourth layer 814. According to an embodiment, the one surface 812-M of the second layer 812 may be used as a pad or land for installing an electronic component thereon. For example, an electronic component may be connected to the one surface 812-M of the second layer 812 using soldering. Alternatively, a contact of the electronic component may be electrically in contact with the one surface 812-M of the second layer 812.

According to various embodiments of the present disclosure, the fifth layer 815 may include at least one penetrating portion 815-P formed by removing a part of the fifth layer 815. One surface 813-M of the third layer 813 may be exposed through the penetrating portion 815-P of the fifth layer 815. According to an embodiment, the one surface 813-M of the third layer 813 may be used as a pad or a land for installing an electronic component thereon.

According to various embodiments of the present disclosure, the second layer 812 and/or the third layer 813 may include a plurality of connection lines 812-L. The plurality of connection lines 812-L may be used to connect between the portions which are separated from each other on the circuit board 81. Alternatively, the plurality of connection lines 812-L may be used to transmit power signals, data signals, etc. Alternatively, the plurality of connection lines 812-L may be used to connect a ground. According to an embodiment, the fourth layer 814 and/or the fifth layer 815 may have light transmittance, and allow the connection lines 812-L of the second layer 812 and/or the third layer 813 to be seen from the outside therethrough.

According to various embodiments of the present disclosure, the plurality of connection lines 812-L of the second layer 812 or the one surface 812-M for soldering may be formed on the portions of the second layer 812 except for the above-described one or more penetrating portions 812-P. In addition, the plurality of connection lines (not shown) of the third layer 813 or the one surface 813-M for soldering may also be formed on the portions of the third layer 813 except for the at least one penetrating portion 813-P. For example, the above-described one or more penetrating portions 812-P, the one surface 12-M for soldering, and the plurality of connection lines 812-L may be formed by forming a layer by coating the one surface 811S1 of the first layer 812 with a conductive material, and then removing pre-defined regions from the layer.

The metal sheet 82 may be connected to the circuit board 81. According to an embodiment of the present disclosure, the metal sheet 82 may be connected to the second layer 812 of the circuit board 81 via an adhesion sheet 83. According to an embodiment, the adhesion sheet 83 may be connected to one surface 812-M2 of the second layer 812 which is exposed through the penetrating portion 814-P2 of the fourth layer 814. In addition, although not shown, the metal sheet 82 may be connected to the one surface 813-M of the third layer 813 which is exposed through the penetrating portion 815-P of the fifth layer 815.

According to various embodiments of the present disclosure, the metal sheet 82 may be extended to cover at least part of one surface 814S1 of the fourth layer 814. When the metal sheet 82 is extended, one surface 82S1 of the metal sheet 82, to which a component may be connected, may also be extended.

According to various embodiments of the present disclosure, the adhesion sheet 83 may have the same thickness as that of the fourth layer 814. According to an embodiment, there may be no difference in height between one surface 83S1 of the adhesion sheet 83 and one surface 814S1 of the fourth layer 814. In addition, when the flat metal sheet 82 is connected to the one surface 83S1 of the adhesion sheet 83, the metal sheet 82 may be in close contact with the circuit board 81.

According to various embodiments of the present disclosure, the adhesion sheet 83 may have thickness larger than that of the fourth layer 814. According to an embodiment, the one surface 83S1 of the adhesion sheet 83 may be placed on a location relatively higher than the one surface 814S1 of the fourth layer 814. In addition, when the flat metal sheet 82 is connected to the one surface 83S1 of the adhesion sheet 83, there may be an empty space between a part of the metal sheet 82 and the circuit board 81.

According to various embodiments of the present disclosure, the adhesion sheet 83 may have thickness smaller than that of the fourth layer 814. According to an embodiment, the one surface 83S1 of the adhesion sheet 83 may be placed on a location relatively lower than the one surface 814S1 of the fourth layer 814. The metal sheet 82 may include a protrusion (not shown). The protrusion may be drawn in through the penetrating portion 814-P of the fourth layer 814 and may be connected to the one surface 83S1 of the adhesion sheet 83.

According to an embodiment of the present disclosure, a part of the metal sheet 82 may be connected to the second layer 812 so as not to overlap the plurality of connection lines 812-L of the second layer 812.

According to various embodiments of the present disclosure, a part of the metal sheet 82 may be connected to the second layer 812 so as to overlap the plurality of connection lines 812-L of the second layer 812 as shown in the drawing. According to an embodiment, the plurality of connection lines 812-L of the second layer 812 may be arranged between a part of the metal sheet 82 and the first layer 811.

According to various embodiments of the present disclosure, the metal sheet 82 may be installed so as not to overlap the other penetrating portions 814-P1 of the fourth layer 814, and may not hide the one surface 812-M of the second layer 812 for soldering. The metal sheet 82 may have various shapes.

According to various embodiments of the present disclosure, the metal sheet 82 may have various shapes according to a component to be connected by soldering. For example, when the component has a large contact surface, the size of the metal sheet 82 may increase. According to an embodiment, the component may be adjacent to a component installed on the one surface 812-M for soldering, but may have a size so that it does not interfere with this component.

The metal sheet 82 may be used as a place where a component (for example, an electronic component or other instruments) is connected using soldering. The one surface 82S1 of the metal sheet 82 may have various shapes (for example, a plane, a curved surface, etc.) according to a component to be soldered. For example, the one surface 82S1 of the metal sheet 82 may have a surface (for example, a plane, a curved surface, etc.) corresponding to one surface of a component to be soldered. The metal sheet 82 may be formed of metal which is easy to solder, such as copper.

According to an embodiment of the present disclosure, the metal sheet 82 may be electrically connected to the circuit board 81. For example, the conductive adhesion sheet 83 may electrically connect between the metal sheet 82 and the circuit board 81.

According to various embodiments of the present disclosure, the metal sheet 82 may not be electrically connected to the circuit board 81. For example, the nonconductive adhesion sheet 83 may insulate between the metal sheet 82 and the circuit board 81.

According to an embodiment of the present disclosure, the metal sheet 82 may be connected to the circuit board 81 to exist as an integral unit with the circuit board 81, but may be treated as an element which is not included in the circuit board 81. In addition, the metal sheet 82 may be formed with the circuit board 81, but may be treated as an element which is not included in the circuit board 81. For example, the circuit board 81 may include a PCB or an FPCB, but the metal sheet 82 may not be regarded as a part of the PCB or the FPCB. According to various embodiments, the component mounting board 800 may provide the metal sheet 82 for connecting a component by soldering instead of the one surface 812-M, 813-M of the circuit board 81. This feature may differ from a related-art component soldering connection method using a pad on a PCB.

According to another embodiment of the present disclosure, the component mounting board 800 including the metal sheet 82 and the circuit board 81 may be treated as a single circuit board (for example, a PCB or an FPCB).

Figure 10:
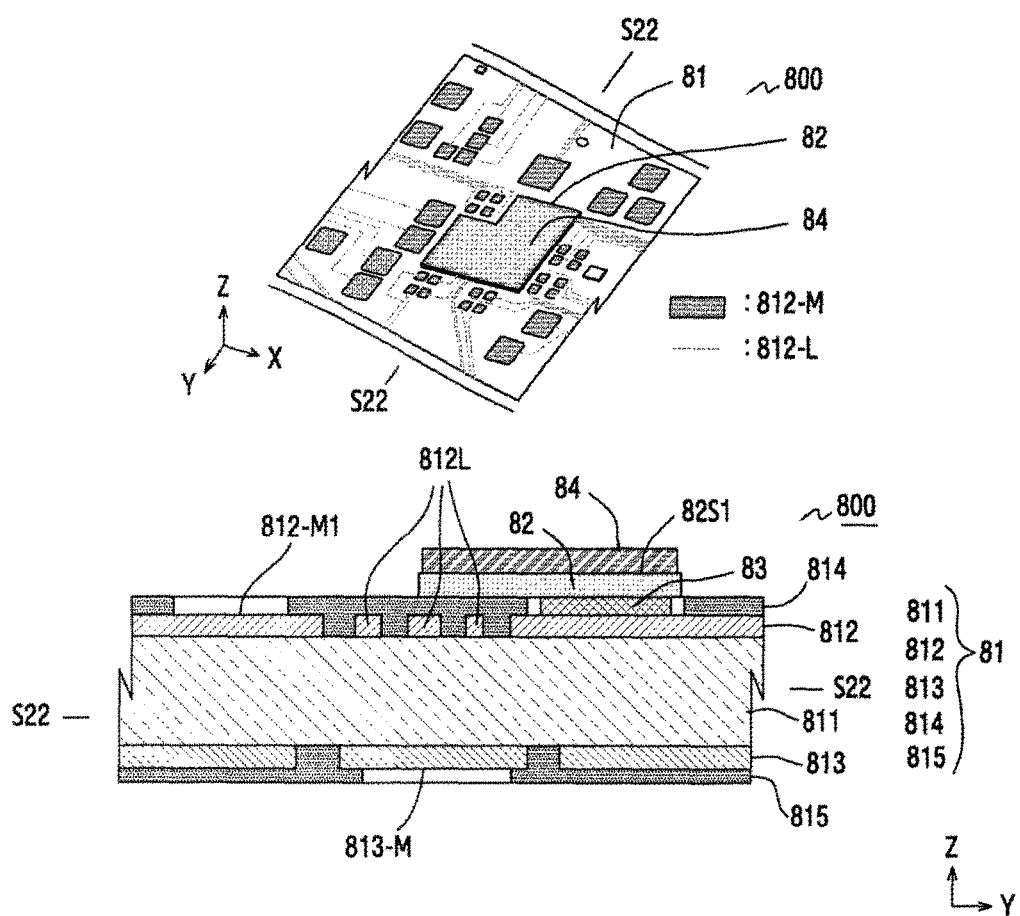
FIG. 10 and FIG. 11 illustrate respective operations of a process of mounting a component on a component mounting board according to various embodiments of the present disclosure.
Figure 11:
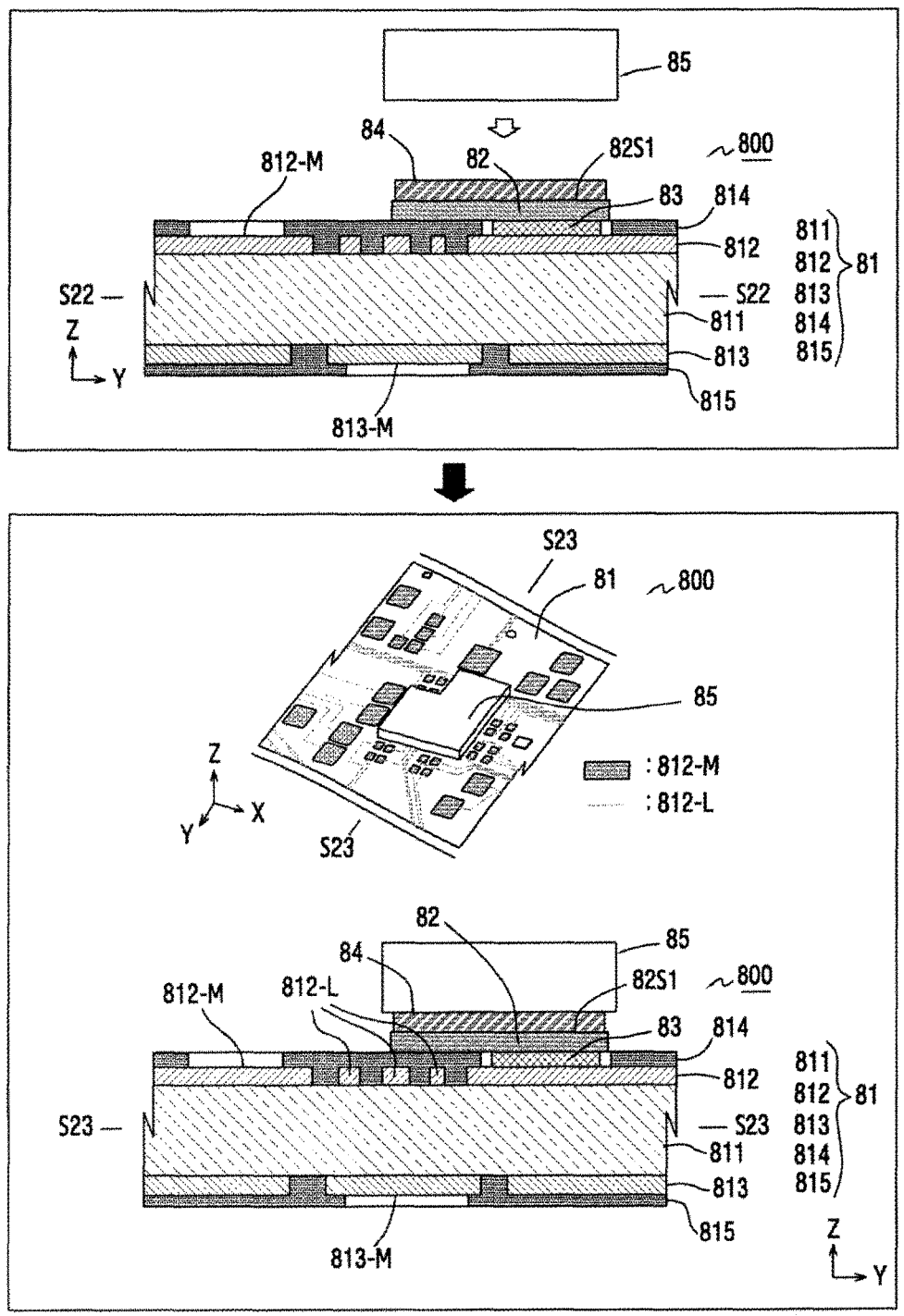

FIGS. 10 and 11 show a process of installing a component on a component mounting board according to various embodiments of the present disclosure.

Referring now to FIG. 10, solder 84 for soldering may be arranged on at least part of the one surface 82S1 of the metal sheet 82 of the component mounting board 800 described above in FIG. 9.

Referring now to FIG. 11, a component 85 may be connected to the metal sheet 82 using the solder 84. In general, a surface mounting method may refer to connecting a component to a pad on a PCB using soldering. According to various embodiments, connecting a component to the metal sheet 82 using soldering according to an embodiment of the present disclosure may also be considered as a part of the surface mounting method. According to various embodiments of the present disclosure, a component to be connected to the one surface 812-M, 813-M of the circuit board 81, and a component to be connected to the one surface 82S1 of the metal sheet 82 may be installed on the component mounting board 800 in a surface mounting process.

According to various embodiments of the present disclosure, the shape of the solder 84 may be similar to those of FIG. 4A or 4B after soldering between the metal sheet 82 and the component 85.

Figure 12:
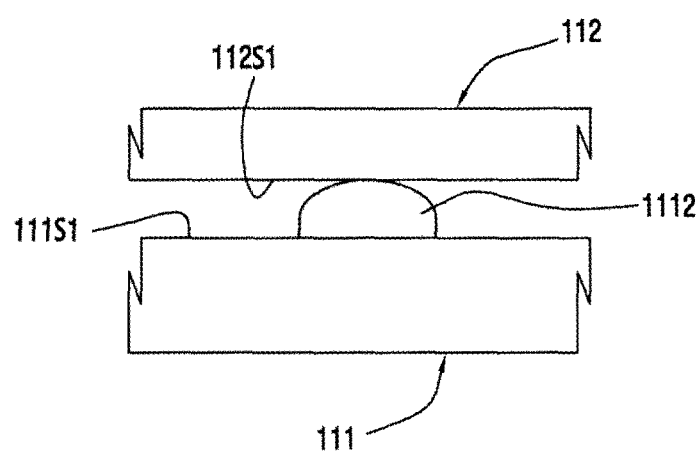
FIG. 12 illustrates an electrical connection between two devices according to various embodiments of the present disclosure.

FIG. 12 illustrates a view schematically showing electric connection between two devices according to various embodiments of the present disclosure.

Referring now to FIG. 12, a conductive contact 1112 which can be electrically in contact with one surface 112S1 (for example, a contact) of a second device (e.g. second constituent part) 112 may be arranged on one surface 111S1 of a first device (e.g. first constituent part) 111. The conductive contact 1112 may protrude relatively with respect to the one surface 111S1. According to various embodiments, the conductive contact 1112 may be formed of a material having elasticity.

According to various embodiments of the present disclosure, the first device 111 may be the circuit board 100 of FIG. 1 or the circuit board 800 of FIG. 9. In addition, the conductive contact 1112 may be the metal sheet 2 of FIG. 1 or the metal sheet 82 of FIG. 9.

According to various embodiments of the present disclosure, the conductive contact 1112 may be connected to an antenna module. Alternatively, the conductive contact 1112 may be connected to a display module. Alternatively, the conductive contact 1112 may be connected to a sensor module. Alternatively, the conductive contact 1112 may be connected to a camera module. Alternatively, the conductive contact 1112 may be connected to a speaker module. Alternatively, the conductive contact 1112 may be connected to a ground. Alternatively, the conductive contact 1112 may be connected to various components or modules performing other functions (for example, removing a noise, shielding from electromagnetic waves, etc.).

According to various embodiments of the present disclosure, the second device 112 may be a circuit board or various components such as a speaker, a microphone, an antenna, etc. Alternatively, the second device 112 may be a removable component such as a memory, a SIM card, a battery, etc.

Figure 13:
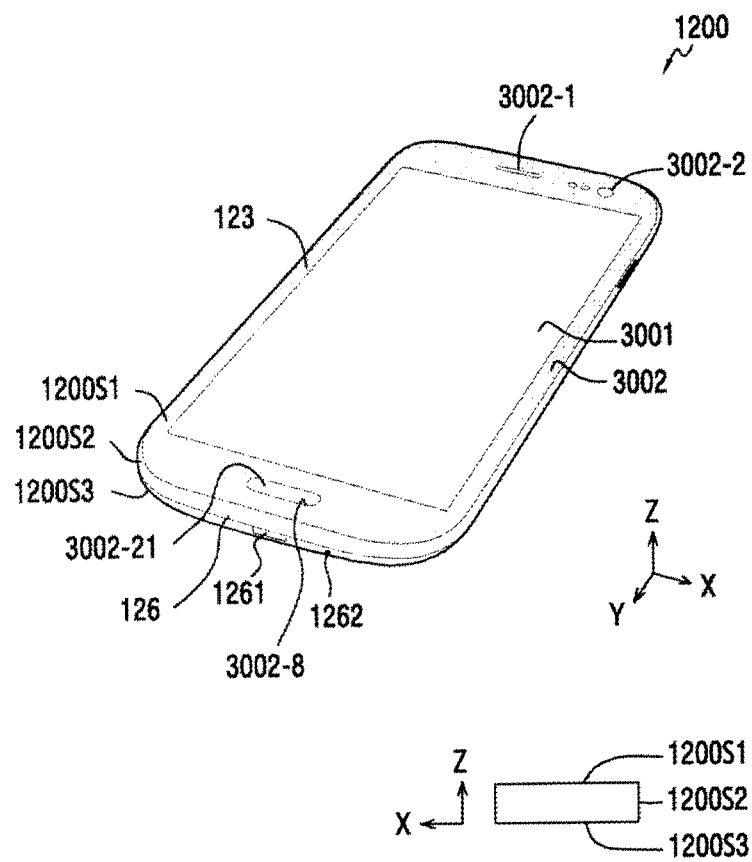
FIG. 13 illustrates an electronic device according to an embodiment of the present disclosure.

FIG. 13 illustrates a view showing an electronic device according to an embodiment of the present disclosure.

Referring now to FIG. 13, the electronic device 1200 may have a substantially rectangular plate shape and may be a rectangle as shown in the drawing. According to various embodiments of the present disclosure, the electronic device 1200 may apply at least one of the configurations shown in FIGS. 1 to 12.

The electronic device 1200 has an exterior including a plurality of surfaces 1200S1, 1200S2, 1200S3. The two surfaces 1200S1 and 1200S3 may be surfaces facing each other, and the other surface 1200S2 may be a surface which connects between the two surfaces 1200S1 and 1200S3, and encloses a space between the two surfaces 1200S1 and 1200S3. The one surface 1200S1 may be a plane as shown in the drawing, but this should not be considered as limiting and the one surface 1200S1 may be a curved surface. For example, one surface 1200S1 may be a convex or concave surface. Another surface (or a bottom surface) 1200S3 may be a plane or a curved surface. According to various embodiments, when another surface 1200S3 is a curved surface, the electronic device 1200 can be rolled using the curved surface.

The electronic device 1200 may include a display set 123 and a device case 126. The display set 123 may be a device which provides a screen 3001, and for example, may include a display such as a liquid crystal display (LCD), an active matrix organic light emitting diode (AM-OLED), etc. Alternatively, the display set 123 may include a touch sensing device (for example, a touch panel or a digitizer panel) which supports a touch input or a hovering input). The display set 123 may form one surface 1200S1 of the electronic device 1200 as shown in the drawing.

The display set 123 may provide a display surface 3001 (that is, a screen) and a non-display surface 3002. The display surface 3001 may be a surface which displays an image by being supported by the display. The display surface 3001 may be formed as a surface which receives a touch by being supported by the touch panel. The non-display surface 3002 may be a surface which is separated from the display surface 3001, and may be shaped to enclose the display surface 3001 and may have color (for example, black) to be distinguished from the display surface 3001, as shown in the drawing.

The non-display surface 3002 may provide a hole 3002-1 for supporting a speaker installed in the electronic device 1200. In addition, the non-display surface 3002 may provide a transparent portion 3002-2 for supporting an optical component (for example, an illuminance sensor, a camera, etc.) According to an embodiment, the non-display surface 3002 may provide a button penetrating hole 3002-8 for supporting a button 3002-21. A button 128 may be exposed to the outside through the button penetrating hole 3002-8 of the non-display surface 3002.

The device case 126 may be connected with the display set 123 and may form at least one surface (for example, 1200S2, 1200S3) of the electronic device 1200. The device case 126 may provide a penetrating hole 1261 for supporting a socket (for example, a USB socket, a charging jack, a communication jack, etc.) installed in the electronic device 1200. In addition, the device case 126 may provide a penetrating hole 1262 for supporting a microphone installed in the electronic device 1200.

According to various embodiments of the present disclosure, in the electronic device 1200, specific configurations may be excluded from the above-described configurations or another configuration may be substituted or may be added. This will be easily understood by an ordinary person skilled in the related art.

Figure 14:
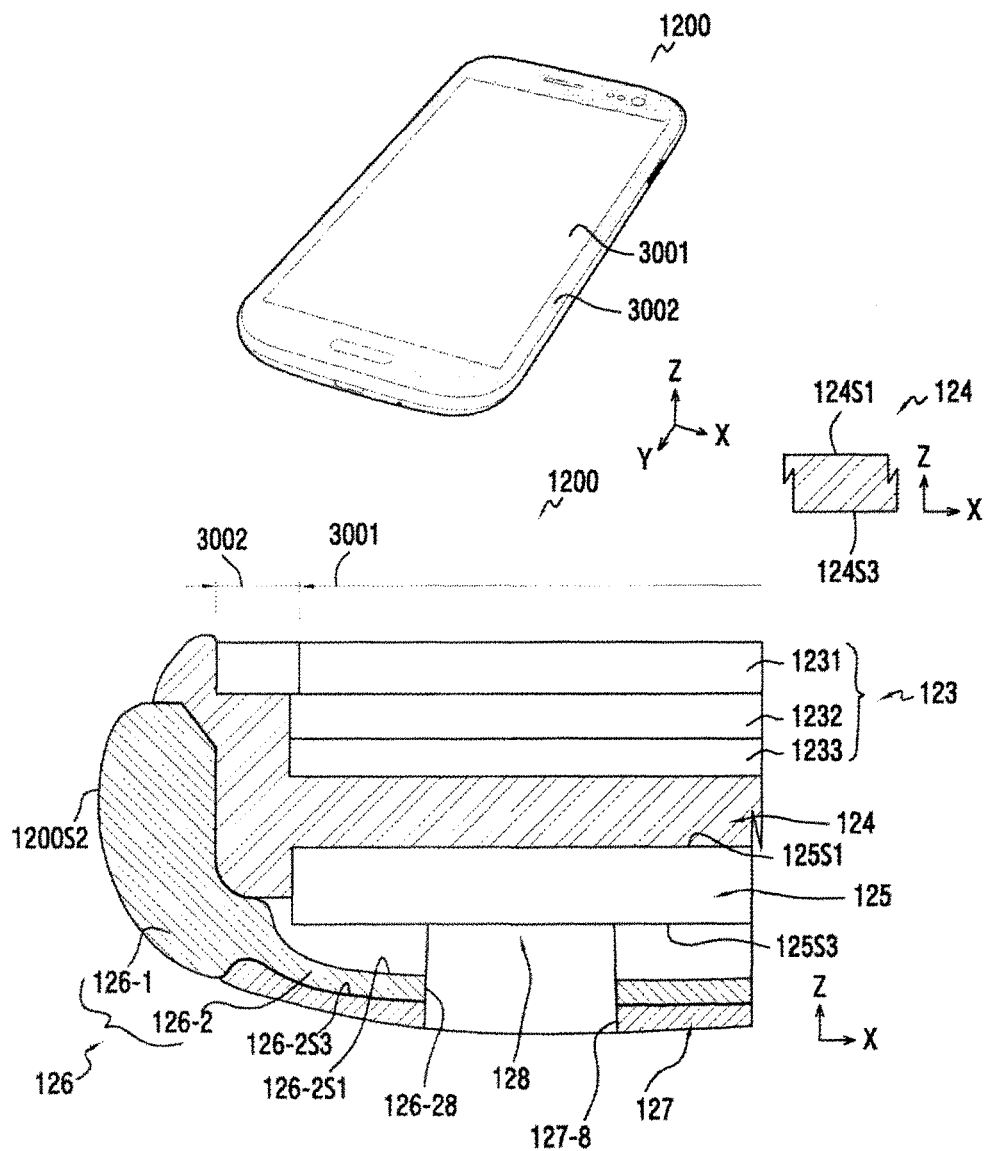
FIG. 14 is a cross sectional view of an electronic device according to an embodiment of the present disclosure.

FIG. 14 illustrates a cross-sectional view of an electronic device according to an embodiment of the present disclosure. Herein, a configuration for a part of the electronic device 1200 may be provided, and this configuration may not be applied to an entirety of the electronic device 1200.

Referring now to FIG. 14, the electronic device 1200 may include a display set 123, a bracket 124, a circuit board 125, a device case 126, a cover 127, and a camera module 128.

The display set 123 may include a window 1231, a display 1232, and a display circuit board 1233. The window 1231 may have a plate shape, and may be arranged on the display 1232 and form one surface (1200S1 of FIG. 13) of the electronic device 1200. The window 1231 may include plastic or glass having shock resistance. The window 1231 may form a transparent region corresponding to the display surface 3001, and an opaque region corresponding to the non-display surface 3002.

The display 1232 may be arranged under the window 1231, and an image of the display 1232 may be seen from the outside through the transparent region of the window 1231. The display 1232 may have a plate shape.

The display circuit board 1233 may be arranged under the display 1232 and may control an image output through the display 1232.

According to various embodiments, the display set 123 may further include a touch panel arranged between the window 1231 and the display 1232. In addition, the display set 123 may further include a digitizer panel arranged between the display 1232 and the display circuit board 1233. The touch panel or the digitizer panel may support a touch input through the display surface 3001 of the display set 123.

The bracket 124 may be a part where the display set 123 and the circuit board 125 are installed, and may substantially have a plate shape corresponding to the rectangular shape of the electronic device 1200. The bracket 124 may be a part where electronic components are installed, and may support one surface 124S1 and the other surface 124S3 which face each other. As shown in the drawing, the bracket 124 may be arranged adjacent to the display set 123 and the circuit board 125, and the one surface 124S1 of the bracket 124 may be supported as a part where the display set 123 can be installed, and the other surface 124S3 of the bracket 124 may be supported as a part where the circuit board 125 can be installed. The one surface 124S1 and the other surface 124S3 of the bracket 124 may have a recess shape so as to have the display set 123 and the circuit board 125 seated therein. Therefore, the display set 123 and the circuit board 125 may be mounted onto the bracket 124 without a gap therebetween by being press-fitted into the bracket 124.

The bracket 124 may give stiffness to the display set 123 and the circuit board 125. In addition, the bracket 124 may be used as a heat sink plate to shield from electromagnetic waves, block an electric noise, or prevent an electronic component from being heated. The bracket 124 may be formed of metal such as magnesium (Mg), aluminum (Al), etc. However, this teaching should not be considered as limiting, and the bracket 124 may be formed of a nonmetallic material such as plastic, etc. Additionally, the bracket 124 may be coated with a material for shielding from electromagnetic waves.

The circuit board 125 (for example, a main board, a mother board, a printed board assembly (PBA)) may configure a plurality of electronic components mounted on one surface 125S1 and/or the other surface 125S3 thereof, and an electric circuit connecting the electronic components. According to various embodiments of the present disclosure, the plurality of electronic components may be connected to a metal sheet (for example, the metal sheet 2 of FIG. 1 or the metal sheet 82 of FIG. 9) connected to one surface 125S1 and/or the other surface 125S2 of the circuit board 125. In addition, the circuit board 125 may be arranged in a state in which the circuit board 125 is connected to the bracket 124.

The one surface 125S1 of the circuit board 125 may be in contact with at least part of the other surface 124S3 of the bracket 124, and the other surface 124S3 of the bracket 124 may provide a space (not shown) to accommodate the electronic components (not shown) installed on the one surface 125S1 of the circuit board 125. A space may be provided between the other surface 125S3 of the circuit board 125 and the device case 126 to accommodate the electronic components installed on the other surface 125S3 of the circuit board 125.

The device case 126 may have a container shape having an upper part substantially opened, and may form the entire frame of the electronic device 1200 by being connected with the bracket 124. The electronic components (for example, the display set 123, the circuit board 125, etc.) may be mounted into the frame structure formed of the device case 126 and the bracket 124, and thus may exist in the electronic device 1200. The device case 126 may include a first part 126-1 forming still another surface 1200S2 of the electronic device 1200, and a second part 126-2 which extends from the first part 126-1 and is arranged under the bracket 124. The first part 126-1 may have a shape matching the shape of the bracket 124, and thus the border of the bracket 124 may be press-fitted into the inner shape of the first part 126-1 and the bracket 124 may be mounted into the device case 126 without a gap as shown in the drawing. The second part 126-2 is shaped to cover the one surface 124S3 of the bracket 124, and an inner surface 126-2S1 of the second part 126-2 may be even. However, this should not be considered as limiting, and the inner surface 126-2S1 of the second part 126-2 may have various uneven shapes. For example, the inner surface 126-2S1 of the second part 126-2 may have at least one rib (not shown) extending toward the bracket 124, and the rib may serve to support the bracket 124. In addition, the inner surface 126-2S1 of the second part 126-2 may have at least one rib (not shown) extending toward the circuit board 125, and the rib may serve to support the circuit board 125. According to an embodiment of the present disclosure, the second part 126-2 may include a penetrating hole 126-28 for the camera module 128.

Additionally, the device case 126 may include a conductive material and may be configured to apply an electric current to a ground surface of the circuit board 125. For example, the inner surface 126-2S1 of the second part 126-2 of the device case 126 may be coated with a conductive material. The electric current may be applied between the conductive material of the device case 126 and the ground surface of the circuit board 125 by bring the rib of the second part 126-2 into contact with the ground surface of the circuit board 125. According to various embodiments of the present disclosure, the rib of the second part 126-2 may include a conductive rubber gasket which is elastically brought into contact with the ground surface of the circuit board 125.

The cover 127 may be connected to the second part 126-2 of the device case 126, and may form one surface 1200S3 of the electronic device 1200. The cover 127 has a curved shape and the one surface 1200S3 of the electronic device 1200 may be formed in a curved shape. The second part 126-2 of the device case 126 may have a recess shape to have the cover 127 seated therein, and accordingly, the cover 127 may be mounted on the second part 126-2 of the device case 126 without a gap by being press-fitted into the second part 126-2 of the device case 126. In addition, the cover 127 may be connected to the second part 126-2 of the device case 126 by snap-fitting, and may be disconnected from the second part 126-2 of the device case 126. The cover 127 may be disconnected from the device case 126 to mount and dismount an electronic component (for example, a memory card, a battery pack, etc.).

According to an embodiment of the present disclosure, the cover 127 may include a hole 127-8 for the camera module 128.

According to an embodiment of the present disclosure, the camera module 128 may be installed on the one surface 125S3 of the circuit board 125. Alternatively, the camera module 128 may be installed on a circuit board (not shown) different from the circuit board 125. According to various embodiments, the camera module 128 may apply at least one of the configurations of FIGS. 5 to 8. According to an embodiment of the present disclosure, the camera module 128 may be arranged in the penetrating hole 126-28 of the device case 126 and the penetrating hole 127-7 of the cover 127, and an image sensor of the camera module 128 may detect light.

According to various embodiments of the present disclosure, additionally, the camera module 128 may be arranged at a location corresponding to the transparent portion 3002-2 of the front surface 1200S1 of the electronic device 1200.

Figure 15:
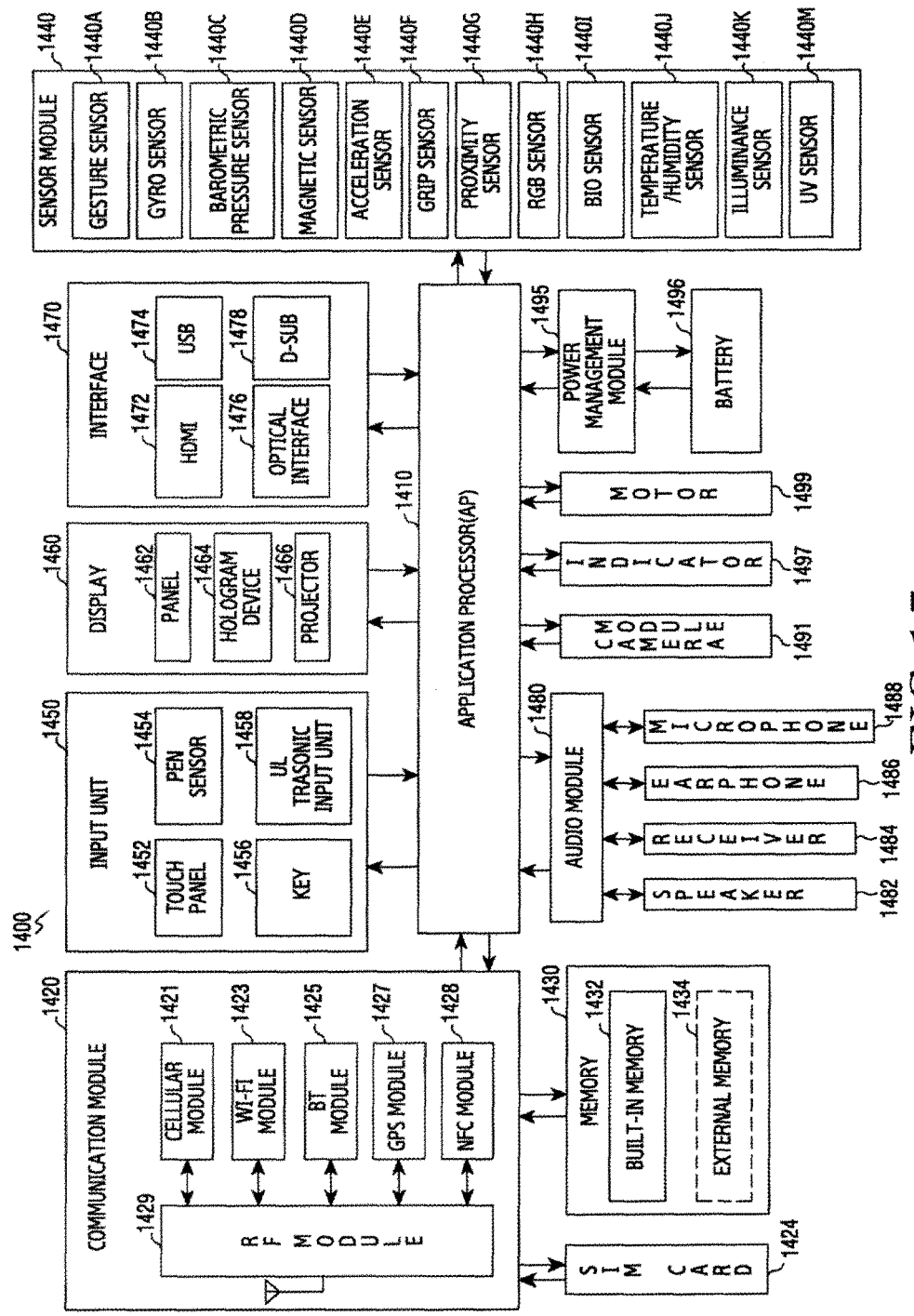
FIG. 15 illustrates a block diagram showing an electronic device according to various embodiments of the present disclosure.

FIG. 15 illustrates a block diagram of an electronic device according to various embodiments of the present disclosure. For example, the electronic device 1400 may include an entirety or part of the electronic device 1200 shown in FIG. 13. Referring now to FIG. 15, the electronic device 1400 may include one or more application processors (APs) 1410, a communication module 1420, a subscriber identification module (SIM) card 1424, a memory 1430, a sensor module 1440, an input device 1450, a display 1460, an interface 1470, an audio module 1480, a camera module 1491, a power management module 1495, a battery 1496, an indicator 1497, or a motor 1499.

The AP 1410 may control a plurality of hardware or software elements connected to the AP 1410 by driving an operating system or an application program, and may process and calculate various data including multimedia data. For example, the AP 1410 may be implemented by using a System on Chip (SoC). According to an embodiment, the AP 1410 may further include a graphic processing unit (GPU).

The communication module 1420 may transmit and receive data in communication between the electronic device 1400 and other electronic devices connected through a network. According to an embodiment, the communication module 1420 may include a cellular module 1421, a WiFi module 1423, a BT module 1425, a GPS module 1427, an NFC module 1428, and a radio frequency (RF) module 1429. These modules include hardware such as a transmitter, receiver, transceiver, etc.

The cellular module 1421 may provide a voice call, a video call, a text service, or an Internet service through a telecommunications network (for example, LTE, LTE-A, CDMA, WCDMA, UMTS, WiBro, GSM, etc.) In addition, the cellular module 1421 may identify and authenticate the electronic device in the telecommunications network by using a subscriber identification module (for example, the SIM card 1424). According to an embodiment, the cellular module 1421 may perform at least some of the functions provided by the AP 1410. For example, the cellular module 1421 may perform at least some of the multimedia control functions.

According to an embodiment, the cellular module 1421 may include a communication processor (CP). In addition, the cellular module 1421 may be implemented by using a SoC, for example. In FIG. 14, elements such as the cellular module 1421 (for example, the CP), the memory 1430, or the power management module 1495 are separate elements from the AP 1410, but, according to an embodiment, the AP 1410 may be implemented to include at least some of the above-mentioned elements (for example, the cellular module 1421).

According to an embodiment, the AP 1410 or the cellular module 1421 (for example, the CP) may load instructions or data received from a non-volatile and non-transitory memory connected thereto or at least one of the other elements onto a volatile memory, and process the instructions or data. In addition, the AP 1410 or the cellular module 1421 may store data received from or generated by at least one of the other elements in the non-volatile memory.

The WiFi module 1423, the BT module 1425, the GPS module 1427, or the NFC module 1428 each may include a processor including circuitry for processing data received and transmitted through a corresponding module. In FIG. 14, the cellular module 1421, the WiFi module 1423, the BT module 1425, the GPS module 1427, or the NFC module 1428 are illustrated as separate blocks, but, according to an embodiment, at least some (for example, two or more) of the cellular module 1421, the WiFi module 1423, the BT module 1425, the GPS module 1427, or the NFC module 1428 may be included in a single integrated chip (IC) or IC package. For example, at least some of the processors corresponding to the cellular module 1421, the WiFi module 1423, the BT module 1425, the GPS module 1427, or the NFC module 1428 (for example, a communication processor corresponding to the cellular module 1421 and a WiFi processor corresponding to the WiFi module 1423) may be implemented by using a single SoC.

The RF module 1429 may transmit and receive data, for example, RF signals. For example, although not shown, the RF module 1429 may include a transceiver, a power amp module (PAM), a frequency filter, a low noise amplifier (LNA), etc. In addition, the RF module 1429 may further include a part for transmitting and receiving electromagnetic waves in a free space in wireless communication, for example, a conductor or conducting wire. In FIG. 14, the cellular module 1421, the WiFi module 1423, the BT module 1425, the GPS module 1427, and the NFC module 1428 share the single RF module 1429 with one another. However, according to an embodiment, at least one of the cellular module 1421, the WiFi module 1423, the BT module 1425, the GPS module 1427, or the NFC module 1428 may transmit and receive RF signals through a separate RF module. The RF module may be coupled to one or more antennas.

The SIM card 1424 may be a card including a subscriber identification module, and may be inserted into a slot formed on a specific location of the electronic device. The SIM card 1424 may include its unique identification information (for example, an Integrated Circuit Card Identifier (ICCID)) or subscriber information (for example, International Mobile Subscriber Identity (IMSI)).

The memory 1430 may include an internal memory 1432 or an external memory 1434. For example, the internal memory 1432 may include at least one of a volatile memory (for example, a Dynamic Random Access Memory (DRAM), a Static Random Access Memory (SRAM), a Synchronous DRAM (SDRAM), and the like) or a non-volatile memory (for example, an One-Time Programmable Read Only Memory (OTPROM), a Programmable Read Only Memory (PROM), an Erasable Programmable Read Only Memory (EPROM), an Electrically Erasable Programmable Read Only Memory (EEPROM), a mask ROM, a flash ROM, a NAND flash memory, a NOR flash memory, and the like).

According to an embodiment, the internal memory 1432 may be a solid state drive (SSD). For example, the external memory 1434 may further include a flash drive, for example, Compact Flash (CF), Secure Digital (SD), Micro-SD, Mini-SD, extreme-Digital (xD), memory stick, and the like. The external memory 1434 may be functionally connected with the electronic device 1400 through various interfaces. According to an embodiment, the electronic device 1400 may further include a storage device (or a storage medium) such as a hard drive.

The sensor module 1440 may measure a physical quantity or detect an operation state of the electronic device 1400, and may convert measured or detected information into electric signals. The sensor module 1440 may include at least one of a gesture sensor 1440A, a gyro sensor 1440B, a barometric pressure sensor 1440C, a magnetic sensor 1440D, an acceleration sensor 1440E, a grip sensor 1440F, a proximity sensor 1440G, a color sensor 1440H (for example, Red, Green, Blue (RGB) sensor), a biosensor 1440I, a temperature/humidity sensor 1440J, an illumination sensor 1440K, or a Ultraviolet (UV) sensor 1440M. Additionally or alternatively, the sensor module 1440 may include an E-nose sensor (not shown), an electromyography (EMG) sensor (not shown), an electroencephalogram (EEG) sensor (not shown), an electrocardiogram (ECG) sensor (not shown), an infrared ray (IR) sensor, an iris sensor (not shown), or a fingerprint sensor (not shown), and the like. The sensor module 1440 may further include a control circuit to control at least one sensor included therein.

The input device 1450 may include a touch panel 1452, a (digital) pen sensor 1454, a key 1456, or an ultrasonic input device 1458. The touch panel 1452 may recognize a touch input in at least one method of capacitive, resistive, infrared, and ultrasonic methods. In addition, the touch panel 1452 may further include a control circuit. In the case of the capacitive, the input device 1450 can recognize a physical contact or hovering. The touch panel 1452 may further include a tactile layer. In this case, the touch pane 1452 may provide a tactile response to the user.

The (digital) pen sensor 1454 may be implemented in the same or similar method as or to the method of receiving a user's touch input or by using a separate recognition sheet. The key 1456 may include a physical button, an optical key, or a keypad, for example. The ultrasonic input device 1458 is a device which allows the electronic device 1400 to detect micro sound waves and identify data through an input device generating ultrasonic signals, and is capable of wireless recognition. According to an embodiment, the electronic device 1400 may receive a user input from an external device connected thereto (for example, a computer, or a server) using the communication module 1420.

The display 1460 may include a panel 1462, a hologram device 1464, or a projector 1466. For example, the panel 1462 may be a Liquid Crystal Display (LCD) or an Active Matrix Organic Light Emitting Diode (AM-OLED). For example, the panel 1462 may be implemented to be flexible, transparent, or wearable. The panel 1462 may be configured as a single module along with the touch panel 1452. The hologram device 1464 may show a stereoscopic image in the air using interference of light. The projector 1466 may display an image by projecting light onto a screen. The screen may be located inside or outside the electronic device 1400. According to an embodiment, the display 1460 may further include a control circuit to control the panel 1462, the hologram device 1464, or the projector 1466.

The interface 1470 may include a high definition multimedia interface (HDMI) 1472, a universal serial bus (USB) 1474, an optical interface 1476, or a D-subminiature (D-sub) 1478. Additionally or alternatively, the interface 1470 may include a mobile high-definition link (MHL) interface, a secure digital (SD) card/multimedia card (MMC) interface, or infrared data association (IrDA) standard interface.

The audio module 1480 may convert a sound and electric signal bidirectionally. For example, the audio module 1480 may process sound information which is input or output through a speaker 1482, a receiver 1484, an earphone 1486, or a microphone 1488.

The camera module 1491 is a device for photographing a still image and a moving image. According to an embodiment, the camera module 1491 may include one or more image sensors (for example, a top surface sensor or a bottom surface sensor), a lens, an image signal processor (ISP) (not shown), or a flash (memory) (for example, a light emitting diode (LED) or a xenon lamp).

The power management module 1495 may manage power of the electronic device 1400. Although not shown, the power management module 1495 may include a power management IC (PMIC), a charger IC, or a battery or fuel gage.

For example, the PMIC may be installed in an integrated circuit or a SoC semiconductor. The charging method may be divided into a wired charging method and a wireless charging method. The charger IC may charge a battery and may prevent inflow of overvoltage or over current from a charger. According to an embodiment, the charger IC may include a charging IC for at least one of the wired charging method and the wireless charging method. The wireless charging method may include a magnetic resonance method, a magnetic induction method, or an electromagnetic wave method, and an additional circuit for charging wirelessly, for example, a circuit such as a coil loop, a resonant circuit, a rectifier, and the like may be added.

For example, the battery gage may measure a remaining battery life of the battery 1496, a voltage, a current, or temperature during charging. The battery 1496 may store or generate electricity and supply power to the electronic device 1400 using the stored or generated electricity. The battery 1496 may include a rechargeable battery or a solar cell.

The indicator 1497 may display a specific state of the electronic device 1400 or a part of it, for example, a booting state, a message state, or a charging state. The motor 1499 may convert an electric signal into a mechanical vibration. Although not shown, the electronic device 1400 may include a processing device (for example, a GPU) for supporting a mobile TV. The processing device for supporting the mobile TV may process media data according to standards such as Digital Multimedia Broadcasting (DMB), Digital Video Broadcasting (DVB), or media flow.

According to various embodiments of the present disclosure, at least one of the elements provided in FIG. 15 may be installed by applying at least one of the configurations of FIGS. 1 to 12.

According to an embodiment of the present disclosure, a portable terminal (for example, the electronic device 1200) may include: a front cover (for example, one surface 1200S1); a back cover (for example, one surface 1200S3); and a circuit board 1 which is arranged between the front cover and the back cover, and includes a conductive pattern (for example, the plurality of connection lines 12-L) inserted into the circuit board. In addition, the portable terminal 1200 may include: a signal generation or power supply element which is electrically connected with the conductive pattern 12-L; and an adhesion layer 3 which is attached onto the circuit board 1 and overlaps at least part of the conductive pattern 12-L when viewed from above the circuit board 1. In addition, the portable terminal 1200 may include: a first structure (for example, the metal sheet 2) which is arranged on the adhesion layer 3 and overlaps at least part of the adhesion layer 3 when viewed from above the circuit board 1; and a second structure (for example, the component 5) which is arranged on a top of the first structure 2, overlaps at least part of the first structure 2 when viewed from above the circuit board 1, and includes a bottom surface including metal. In addition, the portable terminal 1200 may include a metal layer (for example, the solder 4) which is inserted between the first structure 2 and the bottom surface of the second structure 5 to attach the second structure 5 to the first structure 2.

According to an embodiment of the present disclosure, the top of the first structure 2 may include metal.

According to an embodiment of the present disclosure, the first structure 2 may have a plate shape.

According to an embodiment of the present disclosure, the first structure 2 may have a substantially same size and/or shape as the adhesion layer 3 when viewed from above the circuit board 1.

According to an embodiment of the present disclosure, the metal layer may include solder 4.

According to an embodiment of the present disclosure, a border surface of the metal layer 3 may include one of at least one concave portion 41-2 and at least one convex portion 41-1 between the first structure 2 and the second structure 5.

According to an embodiment of the present disclosure, the adhesion layer 3 may be connected to a surface treatment surface (for example, one surface 14S1 or 15S1) of the circuit board 1.

According to an embodiment of the present disclosure, the adhesion layer 3 does not overlap a pad (for example, one surface 12-M) which is exposed on the circuit board 1 for the sake of soldering.

According to an embodiment of the present disclosure, the first structure 2 does not overlap a pad (for example, one surface 12-M) which is exposed on the circuit board 1 for the sake of (e.g. to facilitate) soldering.

According to various embodiments of the present disclosure, an electronic device 1200 may include: a first member (for example, the component 5); a circuit board 1 which includes a conductive pattern (for example, the plurality of connection lines 12-L) arranged therein; a second member (for example, the metal sheet 2) which is arranged between the first member 5 and the circuit board 1; an adhesion layer (for example, the adhesion sheet 3) which is arranged between the second member 2 and the circuit board 1, overlaps at least part of the conductive pattern 12-L of the circuit board 1, and connects between the second member 2 and the circuit board 1; and a metal layer (for example, the solder 4) which is arranged between the first member 5 and the second member 2 and connects between the first member 5 and the second member 2.

According to various embodiments of the present disclosure, the first member (for example, the component 5) may include metal formed on a part thereof connected with the metal layer (for example, the solder 4).

According to various embodiments of the present disclosure, the second member (for example, the metal sheet 2) may include metal formed on a part thereof connected with the metal layer (for example, the solder 4).

According to various embodiments of the present disclosure, the second member (for example, the metal sheet 2) may have a plate shape.

According to various embodiments of the present disclosure, the second member (for example, the metal sheet 2) may have a shape to completely cover the adhesion layer (for example, the adhesion sheet 3).

According to various embodiments of the present disclosure, the second member (for example, the metal sheet 2) may not overlap a pad (for example, one surface 12-M) of the circuit board 1 for soldering.

According to various embodiments of the present disclosure, the second member (for example, the metal sheet 2) may have an annular shape.

According to various embodiments of the present disclosure, the electronic device may further include an electronic component installed on the circuit board 10. According to an embodiment, the electronic component may be enclosed by the annular second member (for example, the metal sheet 2).

According to various embodiments of the present disclosure, the electronic component may be arranged on a recess 107 formed on one surface of the circuit board 10.

According to various embodiments of the present disclosure, the electronic component may be an image sensor.

According to various embodiments of the present disclosure, the first member may include an annular metal bracket (for example, a bracket 50), and a light transmission sheet 70 arranged on a penetrating portion of the metal bracket 50. According to an embodiment, the light transmission sheet may block infrared rays.

According to various embodiments of the present disclosure, the adhesion layer (for example, the adhesion sheet 3) may be connected to a surface treatment layer of the circuit board 1.

According to various embodiments of the present disclosure, the adhesion layer (for example, the adhesion sheet 3) may not overlap a pad (for example, one surface 12-M) of the circuit board 1 for soldering.

According to various embodiments of the present disclosure, the metal layer may include solder 4.

According to various embodiments of the present disclosure, a border of the metal layer (for example, the solder 4) may have a convex shape 41-1 or a concave shape 41-2.

According to various embodiments of the present disclosure, the electronic device may further include a signal generation element or a power supply element which is installed on the circuit board 1, and electrically connected with the conductive pattern (for example, the connection lines 12-L). According to an embodiment, the plurality of connection lines 12-L may be used to transmit power signals, data signals, etc.

According to various embodiments of the present disclosure such as shown in FIG. 14, the electronic device may further include a first cover (for example, the bracket 124) and a second cover (for example, the device case 126). According to an embodiment, a structure including the first member (for example, the component 5), the metal layer (for example, the solder 4), the second member (for example, the metal sheet 2), the adhesion layer (for example, the adhesion sheet 3), and the circuit board 1 may be arranged between the first cover 124 and the second cover 126.

Figure 16:
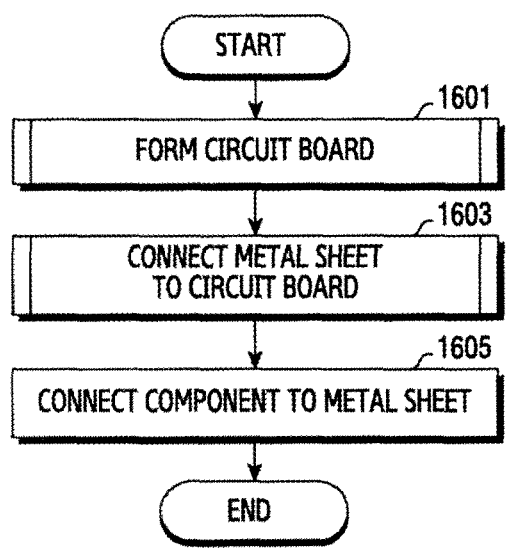
FIG. 16 is a sequence diagram that illustrates a component mounting procedure according to an embodiment of the present disclosure.

FIG. 16 illustrates a sequence diagram to illustrate a procedure of mounting a component according to an embodiment of the present disclosure.

In operation 1601, a circuit board (for example, 1 of FIG. 1 or 81 of FIG. 9) may be formed. According to an embodiment, the circuit board may include a surface treatment layer (for example, 14, 15 of FIG. 1 or 814, 815 of FIG. 9). In addition, the circuit board may include one conductive surface (for example, 12-M, 13-M of FIG. 1 or 812-M, 813-M of FIG. 9) exposed through a penetrating portion (for example, 14-P, 15-P of FIG. 1 or 814-P, 815-P of FIG. 9) formed on the surface treatment layer. The one conductive surface may be used to surface-mount components thereon.

In process 1603, a metal sheet (for example, 2 of FIG. 1 or 82 of FIG. 9) may be additionally connected to the circuit board (1 or 81).

In operation 1605, a component may be connected to the metal sheet (2 or 82). According to an embodiment of the present disclosure, components to be connected to one surface of the circuit board (1 or 81) and components to be connected to one surface of the metal sheet (2 or 82) may be installed altogether in a surface mounting process.

Figure 17:
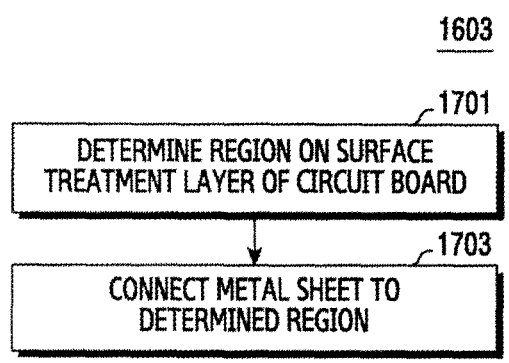
FIG. 17 illustrates a process of connecting a metal sheet to a circuit board in FIG. 16 according to various embodiments of the present disclosure.

FIG. 17 illustrates a view showing a procedure of the process of connecting the metal sheet to the circuit board in FIG. 16 according to various embodiments of the present disclosure.

Referring now to FIG. 17, in operation 1701, a region having the metal sheet 2 attached thereto on the surface treatment layer (for example, 14, 15 of FIG. 1) of the circuit board 1 may be determined. For example, the region may include pads or lands for soldering of the circuit board 1.

In operation 1703, the metal sheet 2 may be connected to the determined region. According to various embodiments, the metal sheet 2 may have a shape varying according to the determined region.

Figure 18:
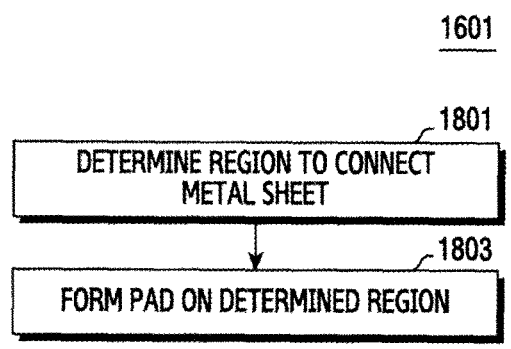
FIG. 18 illustrates a process of forming a circuit board in FIG. 16 according to various embodiments of the present disclosure.

FIG. 18 illustrates a view showing a procedure of the process of forming the circuit board of FIG. 16 according to various embodiments of the present disclosure.

Referring now to FIG. 18, in operation 1801, a region having the metal sheet 82 connected thereto may be determined. For example, the circuit board 81 (FIG. 9) may be designed to distinguish between a region having an electronic component installed thereon, and a region having the metal sheet 82 installed thereon.

In operation 1803, a pad (for example, one surface 812-M of FIG. 9) may be formed on the determined region.

Each of the above-described elements of the electronic device according to various embodiments of the present disclosure may be comprised of one or more components, and the names of the elements may vary according to the kind of the electronic device. The electronic device according to an embodiment of the present disclosure may include at least one of the above-described elements, and some of the elements may be omitted or an additional element may be further included. In addition, some of the elements of the electronic device according to an embodiment of the present disclosure may be combined into a single entity, and may perform the same functions as those of the elements before being combined.

Although the embodiments of the present disclosure have been described through the specification and drawings, and specific terms have been used, these descriptions are used as general meanings to understand the explanation of the technical features of the present disclosure and to understand the present disclosure, and these descriptions do not limit the scope of the present disclosure. A person skilled in the art understands that the embodiments disclosed herein include other variations not shown or described herein.

The apparatuses and methods of the disclosure can be implemented in hardware, and in part as firmware or via the execution of software or computer code in conjunction with hardware that is stored on a non-transitory machine readable medium such as a CD ROM, a RAM, a floppy disk, a hard disk, or a magneto-optical disk, or computer code downloaded over a network originally stored on a remote recording medium or a non-transitory machine readable medium and stored on a local non-transitory recording medium for execution by hardware such as a processor, so that the methods described herein are loaded into hardware such as a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc., that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "processor", "microprocessor" "controller", or "control unit" constitute hardware in the claimed disclosure that contain circuitry that is configured for operation. Under the broadest reasonable interpretation, the appended claims constitute statutory subject matter in compliance with 35 U.S.C. § 101 and none of the elements are software per se. No claim element herein is to be construed under the provisions of 35 U.S.C. 112, sixth paragraph, unless the element is expressly recited using the phrase "means for".

The definition of the terms "unit" or "module" as referred to herein are to be understood as constituting hardware circuitry such as a CCD, CMOS, SoC, AISC, FPGA, at least one processor or microprocessor (e.g. a controller or control unit) configured for a certain desired functionality, or a communication module containing hardware such as transmitter, receiver or transceiver, or a non-transitory medium comprising machine executable code that is loaded into and executed by hardware for operation, in accordance with statutory subject matter under 35 U.S.C. § 101 and do not constitute software per se. For example, the image processor in the present disclosure, and any references to an input unit and/or an output unit both comprise hardware circuitry configured for operation.

In addition, the embodiments set forth in this specification and drawings are suggested to explain and understand features disclosed therein, and do not limit the scope of the technical features set forth in this document. Therefore, the scope of this document should be construed as including all changes based on the technical idea of this document or other various embodiments.

What is claimed is:

1. A portable terminal comprising:
   a circuit board comprising a conductive pattern inserted into the circuit board;
   a signal generation or power supply element being electrically connected with the conductive pattern;
   a non-conductive adhesion layer attached onto the circuit board that overlaps at least part of the conductive pattern when viewed from above the circuit board;

a first structure arranged on the adhesion layer that overlaps at least part of the adhesion layer when viewed from above the circuit board, wherein the first structure includes a metal material and is insulated from the circuit board by the non-conductive adhesion layer, and wherein the first structure has an annular shape;

a second structure arranged above the first structure that overlaps at least part of the first structure when viewed from above the circuit board, and comprises a bottom surface comprising metal;

a metal layer inserted between the first structure and the bottom surface of the second structure so as to couple therebetween; and an optical sensor disposed on the circuit board and enclosed by the annular-shaped first structure, wherein the second structure comprises:
an annular metal bracket; and
a light transmission sheet arranged on a penetrating portion of the metal bracket.

2. The portable terminal of claim 1, further comprising:
a front cover;
a back cover; and
wherein the circuit board is arranged between the front cover and the back cover.

3. The portable terminal of claim 1, wherein a top of the first structure comprises metal.

4. The portable terminal of claim 1, wherein the first structure has a plate shape.

5. The portable terminal of claim 1, wherein the first structure has a substantially same size and/or shape as the adhesion layer when viewed from above the circuit board.

6. The portable terminal of claim 1, wherein the metal layer comprises solder.

7. The portable terminal of claim 1, wherein a border surface of the metal layer comprises one of at least one concave portion or at least one convex portion arranged between the first structure and the second structure.

8. The portable terminal of claim 1, wherein the adhesion layer is in contact with a treatment surface of the circuit board.

9. The portable terminal of claim 1, wherein the adhesion layer does not overlap a pad exposed on the circuit board to facilitate soldering.

10. The portable terminal of claim 1, wherein the first structure does not overlap a pad which is exposed on the circuit board to facilitate soldering.

11. The portable terminal of claim 2, further comprising a wireless communication module and at least one antenna arranged between the front cover and the back cover.

12. An electronic device comprising:
a first member;
a circuit board including a conductive pattern arranged therein;
an annular-shaped second member arranged between the first member and the circuit board and including a metal material;
a non-conductive adhesion layer arranged between the second member and the circuit board so as to couple therebetween;
a metal layer arranged between the first member and the second member so as to couple therebetween; and
an optical sensor disposed on the circuit board and enclosed by the annular-shaped second member,
wherein first member comprises:
an annular bracket; and
a light transmission sheet arranged on a penetrating portion of the metal bracket.

13. The electronic device of claim 12, wherein the second member comprises a metal formed on a part thereof connected with the metal layer.

14. The electronic device of claim 12, wherein the second member does not overlap a pad exposed on the circuit board to facilitate soldering.

15. The electronic device of claim 12, wherein the adhesion layer does not overlap a pad exposed on the circuit board to facilitate soldering.

16. The electronic device of claim 12, wherein the metal layer comprises solder.

* * * * *